(12) United States Patent
Gitchev et al.

(10) Patent No.: US 8,024,690 B2
(45) Date of Patent: Sep. 20, 2011

(54) METHOD, SYSTEM AND COMPUTER PROGRAM PRODUCT FOR DETERMINING ROUTING OF DATA PATHS IN INTERCONNECT CIRCUITRY PROVIDING A NARROW INTERFACE FOR CONNECTION TO A FIRST DEVICE AND A WIDE INTERFACE FOR CONNECTION TO A DISTRIBUTED PLURALITY OF FURTHER DEVICES

(75) Inventors: Kostadin Gitchev, San Jose, CA (US); Bingda Brandon Wang, Milpitas, CA (US)

(73) Assignee: ARM Limited, Cambridge (GB)

( * ) Notice: Subject to any disclaimer, the term of this patent is extended or adjusted under 35 U.S.C. 154(b) by 541 days.

(21) Appl. No.: 12/153,448

(22) Filed: May 19, 2008

(65) Prior Publication Data

US 2009/0288056 A1 Nov. 19, 2009

(51) Int. Cl.
*G06F 17/50* (2006.01)
*G06F 9/455* (2006.01)
*H01L 25/00* (2006.01)

(52) U.S. Cl. ............................ 716/128; 716/116; 326/41

(58) Field of Classification Search .............. 716/6, 14, 716/16–17, 116, 126, 128, 132, 134, 138; 326/38–39, 41
See application file for complete search history.

(56) References Cited

U.S. PATENT DOCUMENTS

| 5,118,300 | A | 6/1992 | Zarreii | |
|---|---|---|---|---|
| 6,279,142 | B1 | 8/2001 | Bowen et al. | |
| 6,654,712 | B1* | 11/2003 | Blair | 703/14 |
| 7,213,221 | B1 | 5/2007 | Celik et a | |
| 7,312,631 | B1* | 12/2007 | Bauer et al. | 326/38 |
| 7,375,553 | B1* | 5/2008 | Kundu | 326/41 |
| 7,759,973 | B1* | 7/2010 | Vadi et al. | 326/41 |
| 2003/0014727 | A1 | 1/2003 | Roohparvar | |
| 2005/0007147 | A1* | 1/2005 | Young | 326/41 |
| 2008/0074142 | A1* | 3/2008 | Henderson | 326/41 |
| 2008/0191740 | A1* | 8/2008 | Kundu | 326/41 |
| 2008/0228460 | A1 | 9/2008 | Lin et al. | |
| 2008/0265937 | A1 | 10/2008 | Sima et al. | |
| 2009/0217225 | A1* | 8/2009 | Sunder et al. | 716/6 |

OTHER PUBLICATIONS

UK Search Report dated Jul. 20, 2009 for GB 0905240.8.

* cited by examiner

*Primary Examiner* — Stacy Whitmore
(74) *Attorney, Agent, or Firm* — Nixon & Vanderhye P.C.

(57) ABSTRACT

A system, method and computer program product are provided for determining routing of data paths in interconnect circuitry for an integrated circuit. The method includes the steps of defining a plurality of cells to be provided along the wide interface of the circuitry, further devices being associated with at least one of the cells, and defining the circuitry as an array of blocks formed in rows and columns, with each cell abutting one of the columns. The method includes the steps of: providing a predetermined set of tiles, each tile providing a predetermined wiring layout, and for each block, applying predetermined rules to determine one of the tiles to be used to implement that block, where the rules take into account the location of the block in the array and any association between the further devices and the cells.

27 Claims, 46 Drawing Sheets

FIG. 7

METHOD, SYSTEM AND COMPUTER PROGRAM PRODUCT FOR DETERMINING ROUTING OF DATA PATHS IN INTERCONNECT CIRCUITRY PROVIDING A NARROW INTERFACE FOR CONNECTION TO A FIRST DEVICE AND A WIDE INTERFACE FOR CONNECTION TO A DISTRIBUTED PLURALITY OF FURTHER DEVICES

BACKGROUND OF THE INVENTION

1. Field of the Invention

The present invention relates to techniques for determining routing of data paths in interconnect circuitry of an integrated circuit.

2. Description of the Prior Art

Current design tools, such as digital layout EDA (electronic design automation) tools used in an ASIC (application specific integrated circuit) design flow process, have a severe limitation in achieving high accuracy in delay matching for timing critical data paths of interconnect circuitry, such as may be required for high speed nets and busses in deep submicron processes. This limitation is primarily due to how EDA tools approach the problem.

The current digital layout EDA tools use timing constraints as the requirement for the design layout. This is often referred to "timing driven place and route". This presents the ASIC layout tool with a practically unlimited number of layout implementations. Faced with this dilemma, EDA tool often use heuristic algorithms to automatically generate ASIC layouts, heuristic algorithms being algorithms which are not designed to determine the optimal solution, but instead are aimed at finding a feasible solution that, in objective function terms, is close to the optimal solution. The initial placement and route of the design rarely satisfies the design timing constraints. As a result the layout tools resort to iterations in place and route of the timing critical portions of the design with the hope of meeting the design timing constraints.

When the design requirements are very restrictive, as for example is typically the case for high speed balanced bus interconnects, the layout iterations often do not converge, and the tool hence fails to generate a usable layout. When the layout tool does succeed in meeting the design requirements, the layouts generated are without symmetry in either element placement or signal routing. Nets are of random length and randomly jump from layer to layer. The resulting capacitance, resistance, coupling and inductance of each net cannot be accurately managed. This results in timing uncertainty in the layout.

Known digital layout EDA tools use several techniques for improving timing. Those techniques include: replacing one driving element with another with the same function but different drive strength; inserting buffers on critical paths to speed or slowdown delay; and/or breaking a long net with repeater buffers; moving critical cells physically closer. The timing variation from those approaches is quantized and introduces timing uncertainties. The matching between different timing critical paths is also greatly reduced over process corners, as those paths are built with different numbers of elements or with elements having different driving characteristics. The different elements' timing characteristics do not scale the same over process-temperature-voltage corners. Meeting one corner often mismatches other corners.

Due to the heuristic nature of the digital EDA layout algorithms, the same design can generate drastically different layouts with different tool versions or versions from different vendors. Often the same tool will produce a different layout with the same design when the layout procedure is repeated.

Another limitation of the current digital EDA layout flow is the inability of the tools to work with differential signalling, this being a method of transmitting information electrically by means of two complementary signals sent on two separate wires. Such differential signalling techniques can enable accurate propagation of fast signals though a noisy environment, such as for example are produced by the switching of digital gates.

As result, the known digital layout EDA tools and ASIC flows cannot produce design layouts that requiring a high degree of delay matching and noise immunity of the critical timing paths, nets and busses (referred to herein as "data paths") within interconnect circuitry.

The limitations of known digital layout EDA tools are exaggerated when different bits of a bus must be routed to design blocks which are not physically close together, yet require matched timing. DDR (double data rate) memory interfaces are a good example of this limitation. DDR memory achieves nearly twice the bandwidth of non-DDR (single data rate) memory by double pumping (transferring data on the rising and falling edges of the clock signal) without increasing the clock frequency. The DDR Memory Controller has a relatively small layout with respect to the span of input/output (I/O) devices to which it must connect, and this places significant timing issues on the design of the interconnect circuitry to be used to couple the memory controller with those distributed I/O devices.

As an example, DDR3 is a parallel interface that uses both edges of the clock for reading and writing data from an off-chip SDRAM at data rates as high as 1600 Mbs. The timing relationship between the data signals DQ, the strobe signal DQS, and the clock signal CK must be tightly controlled, yet the I/O devices for this design may span more than 2 mm linearly (i.e. many orders of magnitude larger than the size of the memory controller block).

Budgeting for uncontrollable timing uncertainties such as clock jitter, on-chip-variation, process-voltage-temperature variations, printed circuit board trace variations, system noise and SDRAM setup and hold timing, requires propagation delay of the data paths within the interconnect circuitry between the Memory Controller and the I/O devices to be matched within tens of nanoseconds. Given interconnect delay which is in the region of hundreds of nanoseconds for nets of 2 mm or more, the design of such interconnect circuitry is difficult to achieve with the current digital layout EDA tools.

Accordingly it would be desirable to provide an improved technique for determining routing of data paths in interconnect circuitry of an integrated circuit, which allows high accuracy in delay matching between the various data paths.

SUMMARY OF THE INVENTION

Viewed from a first aspect, the present invention provides a method of determining routing of data paths in interconnect circuitry for an integrated circuit, the interconnect circuitry on a first side providing a narrow interface for connection to a first device and on a second side providing a wide interface for connection to a distributed plurality of further devices, each data path being associated with one of said further devices and providing a connection through the interconnect circuitry between that associated further device and the first device, the method comprising the steps of: (i) defining a plurality of cells to be provided along the wide interface, each of the further devices being associated with at least one of said cells; (ii) defining the interconnect circuitry as an array of blocks formed in rows and columns, each cell abutting one of said columns; (iii) providing a predetermined set of tiles, each tile providing a predetermined wiring layout; and (iv) for each block, applying predetermined rules to determine one of said tiles to be used to implement that block, the predetermined rules taking into account the location of the block in the array, and the association between the plurality of further devices and the plurality of cells, and ensuring that each data path provided by the interconnect circuitry has the same propagation delay.

In accordance with the present invention, a method is provided for determining the routing for data paths within interconnect circuitry used to couple a first device with a distributed plurality of further devices. The interconnect circuitry has a narrow interface for coupling with the first device and a wide interface for coupling with the distributed plurality of further devices. The interconnect circuitry is considered as an array of blocks formed in rows and columns, and a predetermined set of tiles is provided for use in constructing the interconnect circuitry, each tile providing a predetermined wiring layout. For each block, predetermined rules are applied to determine one of the tiles to be used to implement that block. By arranging the predetermined rules to take in to account the location of the block in the array, and the association between the plurality of further devices and the plurality of cells provided along the wide interface, this tile allocation process ensures that each data path provided by the interconnect circuitry has the same propagation delay.

Accordingly, it can be seen that the present invention provides a structured routing method using predetermined tiles, with predetermined rules being applied to determine which tiles are used to implement each block in the array of blocks forming the interconnect circuitry, so as to ensure that each data path provided by the interconnect circuitry has the same propagation delay.

Through use of the present invention, a number of benefits can arise when compared with the known prior art placement tools. Firstly, in addition to providing an effective mechanism for ensuring that each of the data paths within the interconnect circuitry has the same propagation delay, the process can also match other physical effects such as coupling, cross-talk, loading, noise shielding, etc. Further, in embodiments of the present invention, the method can be implemented without the need for any iteration, hence providing significant design time speed benefits when compared with known EDA tools which need to perform iterative processes with the aim of finding a viable routing design. Furthermore, since the present invention involves using tiles having predetermined wiring layouts to produce data paths having the same propagation delay, this can give rise to interconnect circuits which will consume significantly less power than those designed with known EDA tools, which often insert buffers and/or other components within certain paths in order to improve timing and matching.

In one embodiment, each data path is formed by a sequence of tiles, each tile in the sequence being selected to have a wiring layout that at least partially abuts with the wiring layout in an adjacent tile of the sequence. Hence, each data path is formed by the combination of the various wiring layouts within the associated sequence of tiles used to form that data path. Due to the physical layout of the wires within each tile, the propagation delays associated with each tile will be predetermined. The predetermined set of tiles will provide a variety of different wiring layouts with different propagation delays, and this enables the predetermined rules to determine the appropriate tile to be used to implement each block taking in to account the location of the block within the array and the arrangement of the various further devices to be connected to the interconnect circuitry, in order to ensure that the propagation delays are matched for every data path.

In one embodiment, the predetermined rules allocate tiles to individual blocks in the array so as to produce a tree structure, at least one column abutting the narrow interface being formed as a trunk of the tree structure, and the rows in the remaining columns forming branches of the tree structures. At said step (iv), when determining tiles to be used to implement individual blocks in the array, said predetermined rules then take into account whether a block is in the trunk of the tree structure or a branch of the tree structure. It has been found that the use of such a tree structure enables a particularly efficient routing of the data paths to be achieved.

In one embodiment, said predetermined set of tiles comprise a predetermined subset of trunk tiles and a predetermined subset of branch tiles, during said step (iv), the predetermined rules selecting, for each block, a tile from the subset of trunk tiles if the block is in the trunk of the tree structure, or a tile from the subset of branch tiles if the block is in a branch of the tree structure.

In one embodiment, the number of cells exceeds the number of further devices to be connected to said wide interface, such that at least one non-connect cell exists that does not have one of said further devices associated therewith, and for each column formed as a trunk of the tree structure, the cell chosen to abut that column is a non-connect cell.

Hence, in such embodiments, when the predetermined rules are used to select the trunk tiles used to implement a column of blocks forming the trunk of the tree structure, there is no requirement for those tiles to provide any direct connection with one of the further devices, and instead the connection with the various further devices will occur via branch tiles used to implement the branches of the tree structure.

The tree structure can be designed in a variety of ways. However, in one embodiment, the tree structure comprises one or more tree sections, each tree section having one column abutting the narrow interface to form a trunk for that tree section, and the rows in the remaining columns of the tree section forming branches of that tree section. By enabling the tree structure to be formed from separate tree sections, this provides improved flexibility with regards to the layout of the data path routing and with respect to the placement of the further devices to be connected to the wide interface of the interconnect circuitry. For example, in one embodiment, at least one tree section is provided on a different axis to at least one other tree section, thereby allowing the further devices to be distributed along more then one axis. In one embodiment, such changes in axis may also be accommodated within a tree section itself.

Various types of tree section maybe provided. However, in one embodiment, each tree section comprises either a left tree section or a right tree section, at said step (iv) the predetermined rules applied being dependent on whether tiles are being determined for blocks of a left tree section or are being determined for blocks of a right tree section, whilst still ensuring that each data path provided by the interconnect circuitry, whether in a left tree section or a right tree section, has the same propagation delay. In one embodiment such an approach can be used to produce the interconnect circuit's data path layout as a tree structure with a generally central trunk from which branches are formed in opposing directions. In one embodiment, both the left tree section and the right tree section can be arranged to have the same number of columns and rows, thereby enabling a symmetric design to be produced centred on the trunk of the tree structure.

The distributed plurality of further devices can be located on the integrated circuit in a variety of ways. However, in one embodiment the further devices are distributed on a distribution path following at least one axis. In one embodiment, the further devices may all be arranged along a linear path, whilst in other embodiments the devices may be provided along multiple linear paths which may be orientated differently with respect to each other.

In one embodiment, at least one point in the distribution path a change in access takes place, and the method further comprises the steps of: at said step (ii), defining a corner element within the interconnect circuitry in association with each point in the distribution path where a change in axis take place, such that each corner element defines a change of axis between two adjacent columns of blocks in the array; at said step (iv), the predetermined rules implementing each corner element using predetermined corner tiles contained with said predetermined set of tiles, and when determining tiles to be used for each block in the array the predetermined rules taking into account the location of any corner elements within the interconnect circuitry so as to ensure that each data path provided by the interconnect circuitry has the same propagation delay.

By using predetermined corner tiles, the propagation delays involved in using such corner tiles will be predetermined, and accordingly the predetermined rules can take the location of any corner elements into account when determining for each block an appropriate tile to be used to implement that block within the interconnect circuitry, so as to ensure that each data path within the interconnect circuitry has the same propagation delay.

If the corner elements are relatively short, this will limit the number of branches that can be provided on the far side of the corner element (with respect to the trunk) without layout congestion. In one embodiment, this can be alleviated by defining filler elements on either side of the corner element, and then implementing each filler element using predetermined filler tiles provided within the predetermined set of tiles. Such filler tiles in combination with the corner tiles will effectively extend the size of the corner element to allow for building tree structures that require a large number of branches on the far side of the corner element.

In embodiments where non-connect cells exist, the method may further comprise the step of associating with one or more non-connect cells one or more other components of the integrated circuit that do not require connection to the interconnect circuitry. As an example of such components that can be associated with non-connect cells, such components may comprise power supply lines used to power the distributed plurality of further devices that are to be connected to the interconnect circuitry.

When applying the predetermined rules to determine which tiles to allocate to each block in the array of blocks defining the interconnect circuitry, if the predetermined rules determine that no wiring layout is required at the location of a particular block, then in one embodiment no tile is allocated for that block. In an alternative embodiment, the predetermined set of tiles may include one or more filler tiles having no wiring layout, and if the predetermined rules determine that no wiring layout is required at the location of a particular block, one of those filler tiles is allocated for that block. In one embodiment, such filler tiles may have metal fill to satisfy the metal density requirements for the given process.

In one embodiment, all cells have equal width, as a result of which each of the columns of blocks will be of equal width and the predetermined set of tiles can hence be made of equal width. However, in alternative embodiment the plurality cells defined are of a plurality of different widths, and the predetermined set of tiles include tiles having a corresponding plurality of different widths, so as to enable each cell to abut one of said columns.

However, in an alternative embodiment, the need to provide tiles for every possible width of cell can be avoided through use of filler cells. More particularly, at said step (i) certain cells are formed by a combination of an initial cell and a filler cell, such that each cell abutting with a column in the array is of equal width. By such an approach, each column of blocks can be arranged to be of the same width, and accordingly the predetermined set of tiles only needs to include tiles of that specified width, thereby reducing the number of tiles that need to be provided within the predetermined set.

In one embodiment, the first device is connected directly to the narrow interface of the interconnect circuitry. However, in an alternative embodiment the method further comprises the step of: defining a root channel passing from the narrow interface of the interconnect circuitry to the first device, thereby allowing placement of the first device within the integrated circuit at a location other than that of the narrow interface. In one particular embodiment, said predetermined set of tiles include a subset of root tiles, the method further comprising the step of producing the root channel using one or more root tiles from said subset. By such an approach, this provides freedom with regards to the placement of the first device with respect to the placement of the distributed plurality of further devices, whilst still ensuring that each data path provided by the interconnect circuitry has the same propagation delay. In particular, in one embodiment the propagation delay of each data path through the root channel is identical, and hence the inclusion of the root channel maintains the propagation delay matching properties of the technique of embodiments of the present invention.

The first device and the further devices can take a variety of forms. In one embodiment, the distributed plurality of further devices comprise input/output devices placed around the periphery of the integrated circuit. In one such device, the first device is a memory controller device used to control the plurality of input/output devices. Memory interfaces such as SDR, DDR and parallel bus architectures such as PCI are prime examples of technologies which can benefit from the routing methodology of embodiments to the present invention. More generally, the technique of embodiments to the present invention is applicable to all interconnect circuitry where a high degree of timing matching is required for the data paths connecting a narrow interface to devices spaced physically relatively far apart along a wide interface.

In one embodiment, the various further devices connect directly to the adjacent tile in the associated column within the interconnect circuitry. However, in an alternative embodiment the method further comprises the steps of: providing one or more bridge tiles that provide pin mappings between pins of said further devices and wiring layouts of tiles in said predetermined set of tiles; and when, for a particular further device, there is not a direct mapping of its pins to the wiring layout of the tile in the interconnect circuitry that it is to abut to, introducing at least one bridge tile between said particular further device and said tile in the interconnect circuitry to map the pins of said particular further device to the wiring layout of that tile. Hence, such bridge tiles can be used to convert the pin locations on the further device to conform to the pin locations required for abutting with the relevant tile in the interconnect circuitry. Such bridge tiles can also serve to avoid accidental abutment of wiring within the interconnect circuitry with pins in the further devices which do not require connection through the interconnect circuitry.

In one embodiment, where non-connect cells are provided along the wide interface, addition of such non-connect cells has no effect on the narrow interface. Further, in such embodiments, addition of such non-connect cells along the wide interface has no effect on the order in which the data paths connect to the narrow interface. Hence, there is a great degree of flexibility in the manner in which the cells are provided along the wide interface, and the association between the further devices and the individual cells.

In one embodiment, the wiring layout of at least one of the tiles in the predetermined set is such that when that at least one of the tiles is used to implement a block within said array, not all of the wiring layout within that tile is utilised. Hence, in such embodiments, not all of the individual wires within the wiring layout of each tile will be utilised in all instantiations of that tile within the interconnect circuitry. By designing tiles in such a way, this provides improved flexibility with regards to the use of those tiles.

Viewed from a second aspect, the present invention provides a computer program product comprising a computer program which when executed on a computer system causes the computer system to perform a method to determine routing of data paths in interconnect circuitry for an integrated circuit, the interconnect circuitry on a first side providing a narrow interface for connection to a first device and on a second side providing a wide interface for connection to a distributed plurality of further devices, each data path being associated with one of said further devices and providing a connection through the interconnect circuitry between that associated further device and the first device, the method comprising the steps of: (i) defining a plurality of cells to be provided along the wide interface, each of the further devices being associated with at least one of said cells; (ii) defining the interconnect circuitry as an array of blocks formed in rows and columns, each cell abutting one of said columns; (iii) providing a predetermined set of tiles, each tile providing a predetermined wiring layout; and (iv) for each block, applying predetermined rules to determine one of said tiles to be used to implement that block, the predetermined rules taking into account the location of the block in the array, and the association between the plurality of further devices and the plurality of cells, and ensuring that each data path provided by the interconnect circuitry has the same propagation delay.

Viewed from a third aspect, the present invention provides a system for determining routing of data paths in interconnect circuitry for an integrated circuit, the interconnect circuitry on a first side providing a narrow interface for connection to a first device and on a second side providing a wide interface for connection to a distributed plurality of further devices, each data path being associated with one of said further devices and providing a connection through the interconnect circuitry between that associated further device and the first device, the system comprising: means for defining a plurality of cells to be provided along the wide interface, each of the further devices being associated with at least one of said cells; means for defining the interconnect circuitry as an array of blocks formed in rows and columns, each cell abutting one of said columns; means for providing a predetermined set of tiles, each tile providing a predetermined wiring layout; and data path determining means which, for each block, applies predetermined rules to determine one of said tiles to be used to implement that block, the predetermined rules taking into account the location of the block in the array, and the association between the plurality of further devices and the plurality of cells, and ensuring that each data path provided by the interconnect circuitry has the same propagation delay.

BRIEF DESCRIPTION OF THE DRAWINGS

The present invention will be described further, by way of example only, with reference to embodiments thereof as illustrated in the accompanying drawings, in which:

FIG. 7 schematically illustrates a right tree section produced in accordance with one embodiment of the present invention;

DESCRIPTION OF EMBODIMENTS

Figure 1:
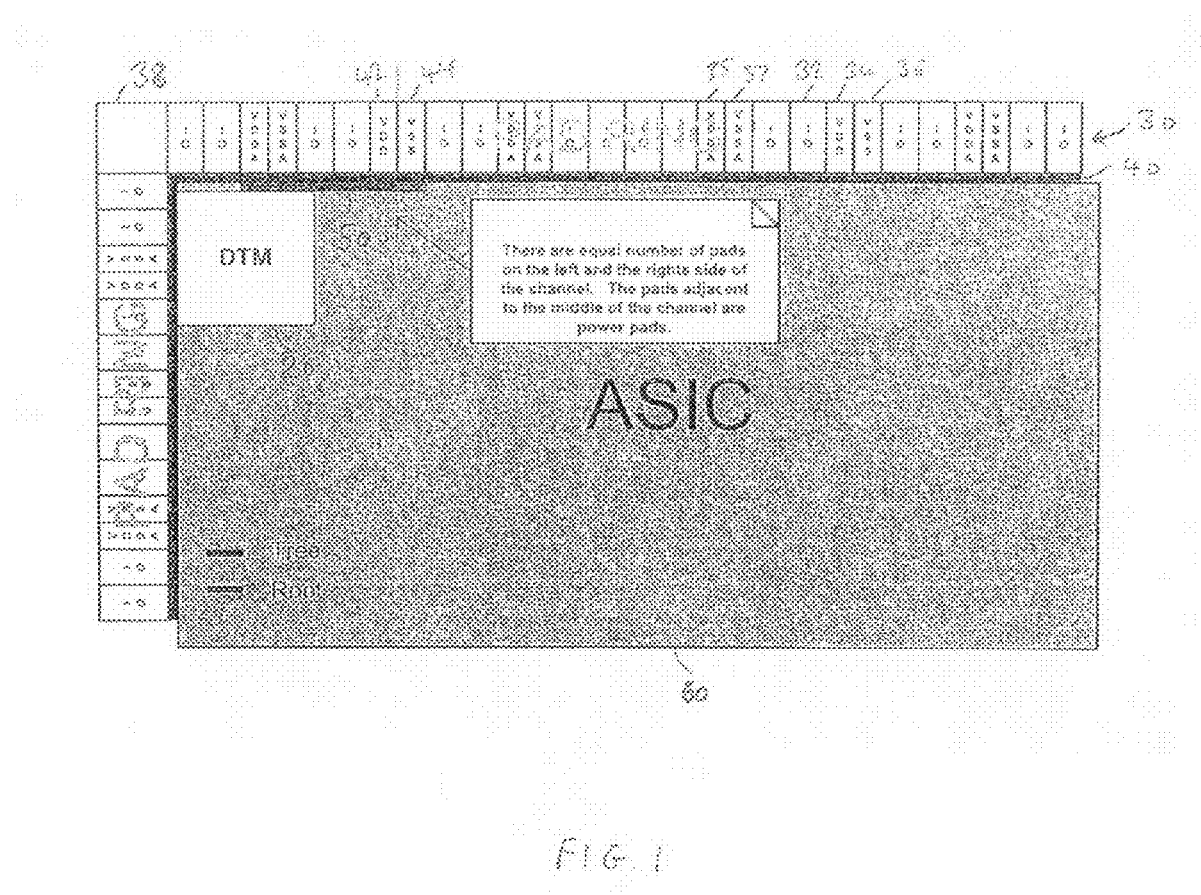
FIG. 1 is a diagram schematically illustrating an integrated circuit incorporating interconnect circuitry produced using the technique of embodiments of the present invention.

FIG. 1 is an illustrative example of an integrated circuit 60 incorporating an interconnect circuit 40 designed using the techniques of embodiment of the present invention.

As shown in FIG. 1, a plurality of devices/components spanning two sides of the integrated circuit 60 are connected to a device 20 within the integrated circuit via the interconnect circuitry 40. The devices 30 include devices which require connection to the device 20 via the interconnect circuitry 40, in FIG. 1 these devices being labelled as IO (input/output) devices, and also may include one or more devices which do not require connection to the device 20. In FIG. 1 the power supply components "VDD" 34, "VDDA" 35, "VSS" 36 and "VSSA" 37 are examples of such components which do not require connection to the device 20. A corner element 38 may also be provided at the junction between two linear distribution paths of devices.

The interconnect circuitry 40 provides a wide interface to the distributed devices 30, but presents a narrow interface to the device 20. As shown in FIG. 1, a root channel 50 may be provided for routing signals from the narrow interface of the interconnect circuitry 40 to the device 20 so as to increase flexibility as to where the device 20 is positioned within the integrated circuit 60. Alternatively, the device 20 can be connected directly to the narrow interface of the interconnect circuitry without the need for such a root channel.

As will be discussed in more detail later, when designing the interconnect circuit, a number of cells (also referred to in FIG. 1 as pads) are provided along the wide interface of the interconnect circuit, with each of the various devices/components 30 then being associated with at least one of those cells. In one embodiment, each device 30 is associated with one of the cells, but in alternative embodiments certain of the devices may be associated with more than one cell, for example if a device is too large to be associated with a single cell.

In one embodiment of the present invention, the data paths within the interconnect circuitry are designed so as to adopt a tree structure including a trunk portion and a number of branch portions. The tree structure can comprise one or more tree sections, and may for example include a left tree section and/or a right tree section. In the example of FIG. 1, the tree structure comprises both a left tree section and a right tree section, with the left tree section being to the left of the dotted line shown in FIG. 1 and the right tree section being to the right of the dotted line. The trunk of each tree section is aligned with the cell either side of the dotted line, and hence the trunk of the left tree section is aligned with the VDD cell 42 and the trunk of the right tree section is aligned with the VSS cell 44.

In the embodiments shown in FIG. 1, there are an equal number of cells/pads in the left tree section and the right tree section. By placing such a constraint on the design, it is easier to produce an interconnect circuit where the various data paths have the same propagation delay, as will be discussed in more detail with reference to the remaining figures. However, in alternative embodiments, it would be possible to remove this constraint if different types of tiles were designed for the left tree section and the right tree section, respectively, so as to ensure that all data paths within the interconnect circuitry have the same propagation delay.

In FIG. 1, it is assumed that the device 20 is a memory controller device, and the distributed plurality of devices provided along the wide interface of the interconnect circuit are IO devices 32 controlled by the memory controller device. However, the technique of embodiments of the present invention can also be applied to any other interconnect structure where a device needs to be coupled via an interconnect to a distributed plurality of other devices in a manner where propagation delay is matched for all of the data paths through the interconnect.

Figure 2:
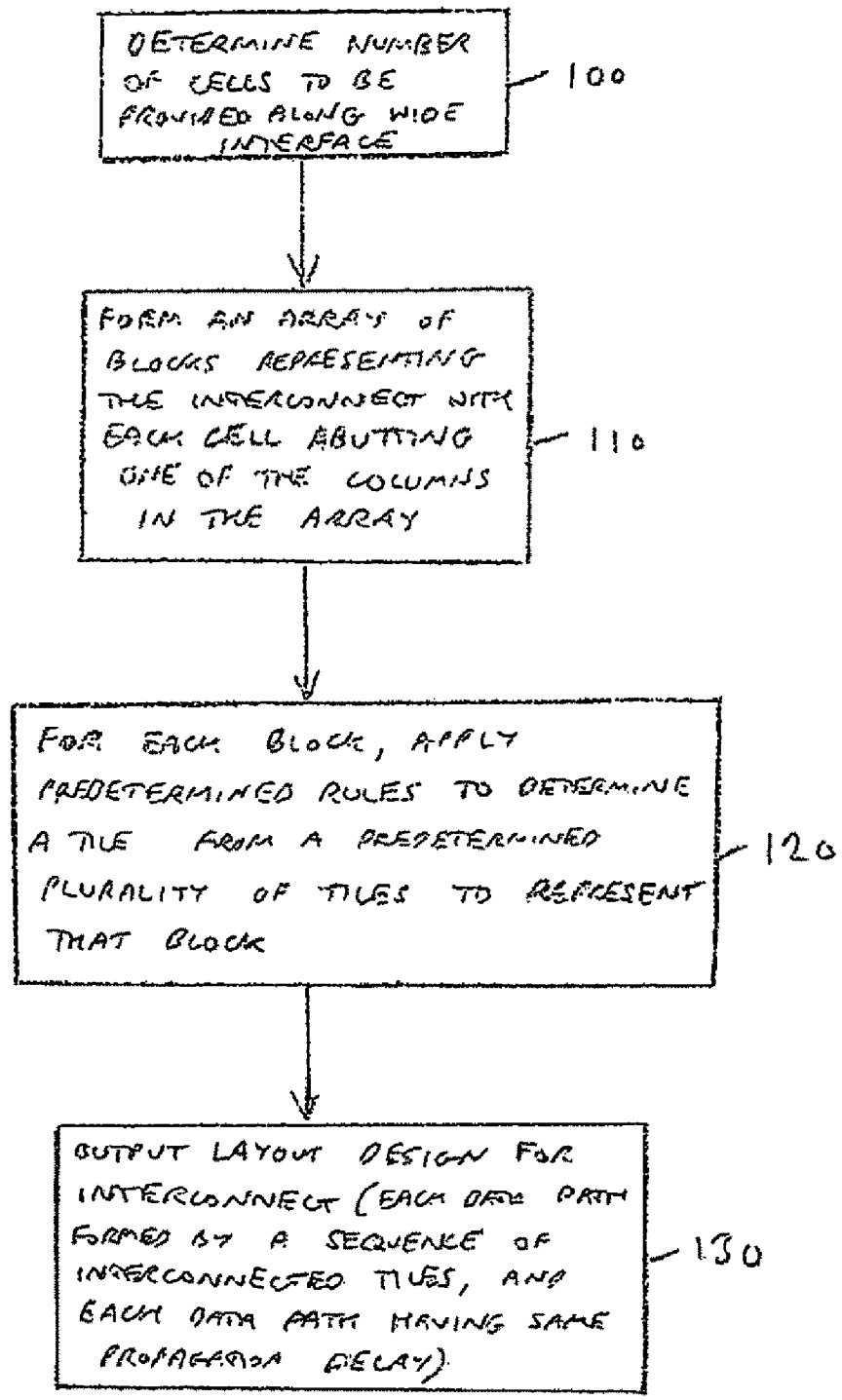
FIG. 2 is a flow diagram illustrating the method used in one embodiment of the present invention to determine routing of data paths in the interconnect circuitry.

FIG. 2 schematically illustrates the method used in one embodiment of the present invention to determine the routing of data paths within the interconnect circuitry 40. Firstly, at step 100, the number of cells to be provided along the wide interface of the interconnect circuit is determined. This is determined having regards to the number of devices which must connect to the device 20 through the interconnect circuit, and the number of non-connecting components that need to be accommodated. In one embodiment of the present invention, it is a requirement that there is a non-connecting component associated with the cell that is aligned with any trunk portion of the tree structure.

Following step 100, at step 110, an array of blocks is formed to represent the interconnect, the array being formed into rows and columns of blocks. Each cell then abuts one of the columns in the array. Hence, it can be seen that the number of cells determined at step 100 determines the number of columns that need to be provided in the array. In one embodiment, the number of rows is chosen to be one less than the number of columns in any particular tree section of the tree structure. Hence, purely by way of example, if there are 100 cells determined at step 100, and the interconnect circuitry is to be formed by a tree structure having a left tree section and a right tree section, each tree section will have 50 columns, and 49 rows.

At step 120, each block within the array is considered in turn, and for each block considered, predetermined rules are applied to determine a tile from a predetermined plurality of tiles to be used to represent that block. As will be discussed in more detail later, a predetermined set of tiles are provided, each tile having a predetermined wiring layout within it. Different tiles will be provided for different widths of cell, and accordingly different widths of columns within the interconnect circuitry. The predetermined rules take into account the location of the block in the array, and the association between the plurality of devices being connected to the interconnect circuitry (e.g. the IO cells 32 in FIG. 1) and the plurality of cells (i.e. taking into account which cells those various devices are associated with). Based on this information, the predetermined rules can choose an appropriate tile for each block location, so that once each of the blocks has been considered, the required data paths between the device 20 and each of the IO devices 32 will be provided within the interconnect circuitry, such that each of those data paths has the same propagation delay.

Accordingly, as shown by step 130, once each block has been considered at step 120, a layout design is output for the interconnect circuit, with each required data path being formed by a sequence of interconnected tiles, and each data path having the same propagation delay.

Figure 3:
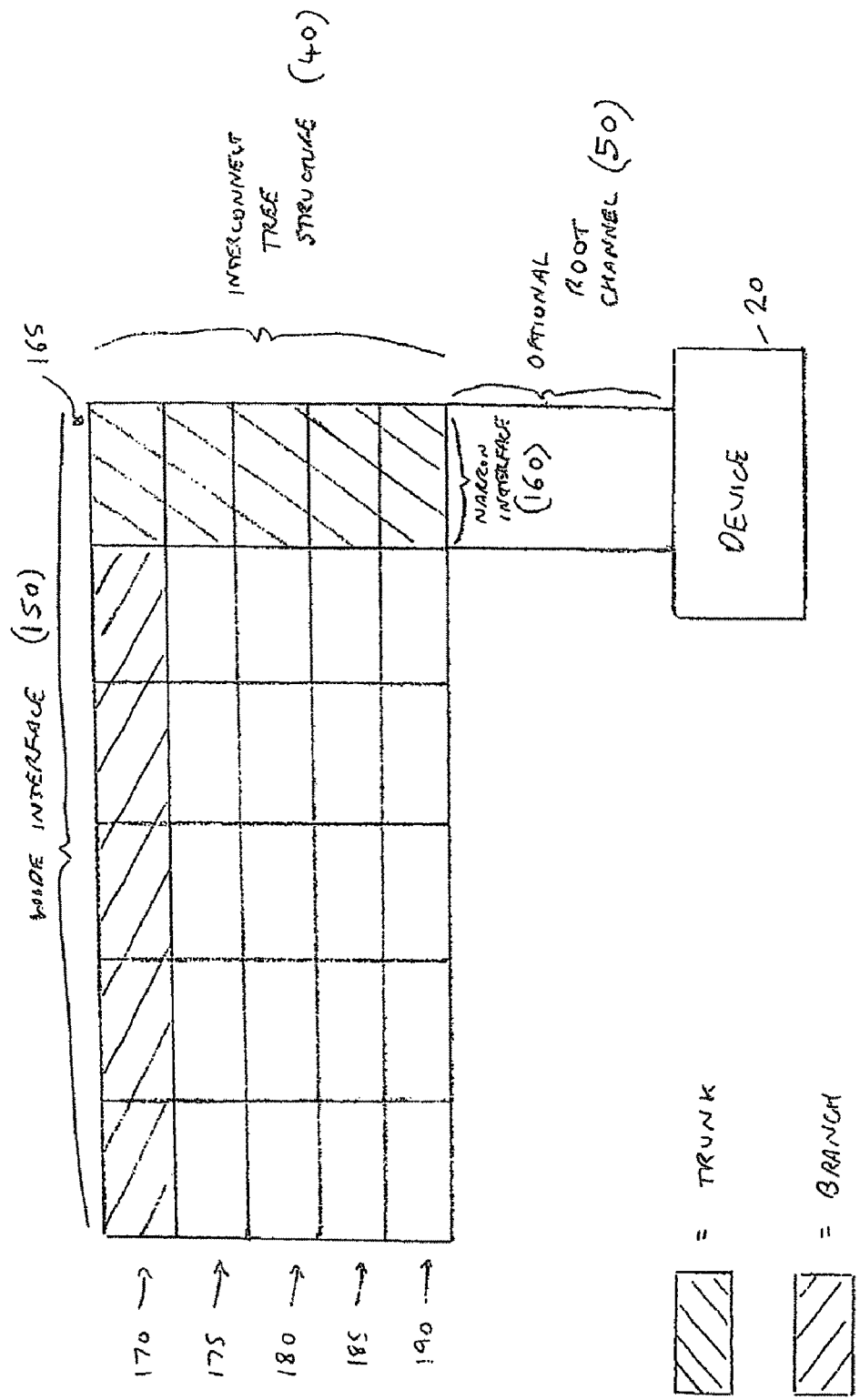
FIG. 3 schematically illustrates the tree structure used for the interconnect circuitry in embodiments of the present invention.

FIG. 3 schematically illustrates the tree structure used for the interconnect circuit 40 in more detail. As shown, the device 20 can be coupled via an optional root channel 50 to a narrow interface 160 of the interconnect tree structure 40. In this example, the interconnect tree structure 40 is formed as a left tree section having a trunk formed by the column 165, and a plurality of branches 170, 175, 180, 185, 190 emanating to the left of the trunk 165. In this example, it can be seen that the array of blocks is constituted as five rows and six columns, with the six columns providing the wide interface 150 to the various cells with which the devices are to be associated. In this example, there will accordingly be six cells along the wide interface and associated with each cell will be either a device to be connected to the interconnect, or a device/component which is not to be connected to the interconnect.

Figure 4:
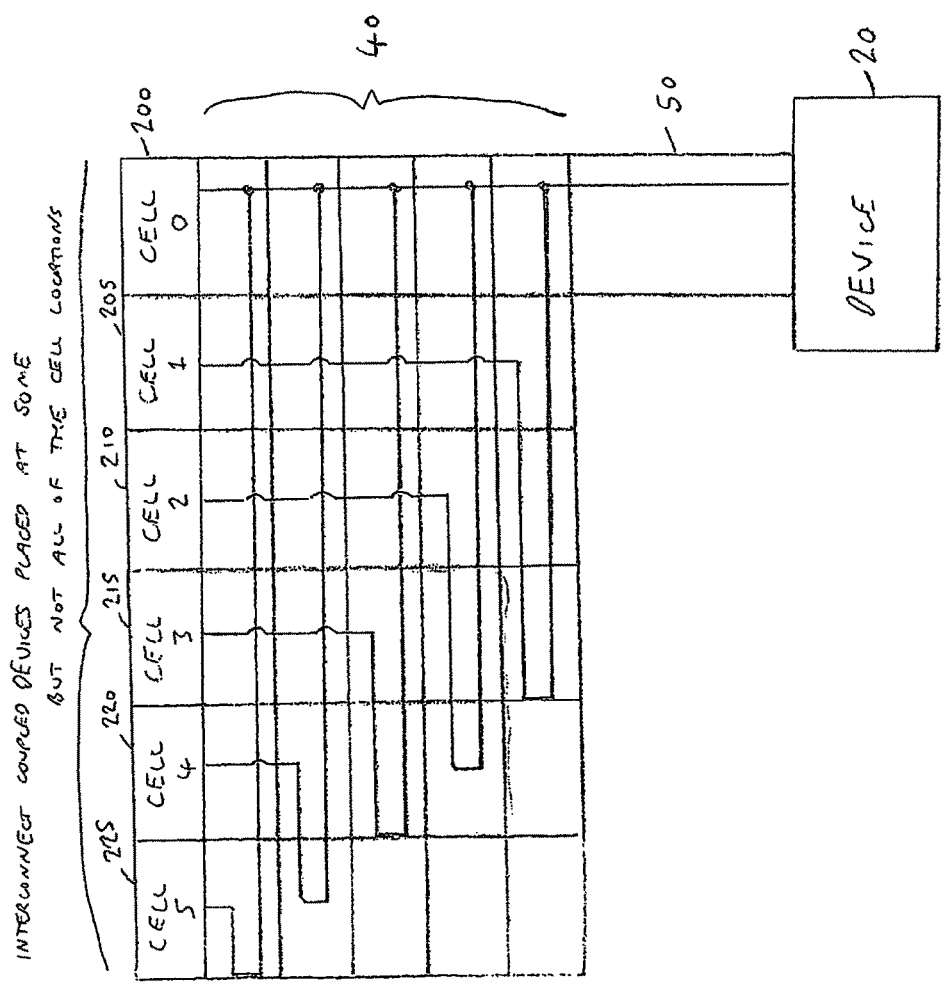
FIG. 4 schematically illustrates how the wiring layouts in individual tiles are used to produce the various data paths within the interconnect circuitry in accordance with one embodiment of the present invention.

FIG. 4 illustrates the same formation of interconnect tree structure 40, but illustrates schematically the data paths that may be produced within that tree structure once tiles have been allocated to each of the blocks. As before, the optional root channel 50 is provided to connect the device 20 to the narrow interface of the interconnect 40. As will be appreciated from FIG. 4, the data paths provided between the device 20 and the cells 1 to 5 are each of the same length, and will accordingly have the same propagation delays. As discussed earlier, any device associated with cell 0 200 needs to be chosen to be a device which is not requiring connection to the interconnect 40, given the earlier mentioned constraint that any device requiring connection to the interconnect is not placed in a position where it abuts the trunk of the tree structure. Regarding the other cells 205, 210, 215, 220, 225, these may all have connected devices associated with them, or one or more of them may have non-connected devices associated with them.

Figure 5:
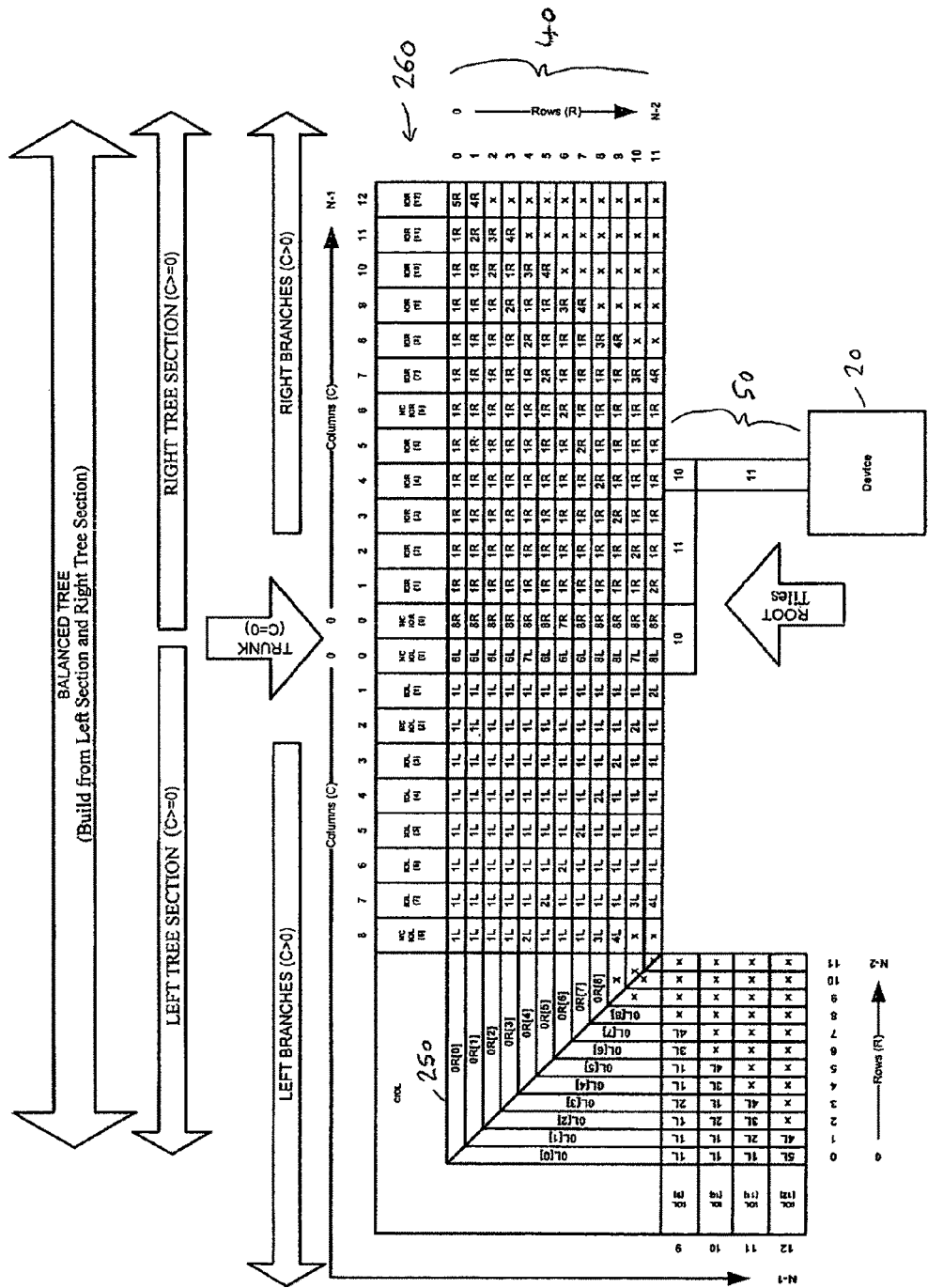
FIG. 5 schematically illustrates interconnect circuitry produced in accordance with one embodiment of the present invention as a balanced tree structure comprising both left and right tree sections.

FIG. 5 is an example of an interconnect circuit configuration produced using one embodiment of the present invention. Those IO cells 260 labelled NC (non-connect) are cells which are to be associated with components/devices that do not require connection to the device 20 via the interconnect circuitry. This example illustrates the main subcomponents of this interconnect:

Root 50—this connects device 20 to the tree structure 40. The root is built using tiles 10 and 11.

Tree structure 40—this connects the root 50 to the individual IO cells 260. It is built using the tiles 0L, 0R, 1L, 1R, 2L, 2R, 3L, 3R, 4L, 4R, 5L, 5R, 6L, 6R, 7L, 7R, 8L and 8R. This makes up the main body of the interconnect circuitry.

The tree itself is divided into two sections. The left tree section is built using 0L, 0R, 1L, 2L, 3L, 4L, 5L, 6L, 7L, and 8L tiles. In FIG. 5, the left tree section spans from the middle of the figure, column C=0, to the left ending with column C=12. This section contains a corner element 250 which is not given a column number. A corner element is built with 0L and 0R tiles. Each 0L and 0R tile is indexed by its row number. In FIG. 5, the index is shown in square brackets as 0L[R] and 0R[R], where R in the square brackets is the row associated with the tile.

The right tree section is build using 0L, 0R, 1R, 2R, 3R, 4R, 5R, 6R, 7R, and 8R tiles. In FIG. 5, the right tree section spans from the middle of the figure, column C=0, to the right ending with column C=12. This section in FIG. 5 does not contain a corner, but corners can be incorporated into the layout of the right tree section if desired.

The left and right tree sections are again divided into two parts, namely the trunk and the branches. The left tree branches and the right tree branches are built using 0L, 0R, 1L, 1R, 2L, 2R, 3L, 3R, 4L, 4R, 5L, and 5R tiles. They are contained in columns with values C>0. The tree branches have the same numbers as the rows R of the tree. The rows are shown on the left bottom and right side of the figure for the left and right tree sections respectively.

The tree trunks are built using 6L, 6R, 7L, 7R, 8L and 8R tiles. In FIG. 5, the tree trunks are made of the tiles in columns C=0.

Tiles which are labelled X are "don't care" tiles, and they can either be omitted when producing the interconnect circuitry, or instead a tile containing metal fill cell can be used to meet metal fill density requirements by the technology.

Figure 6:
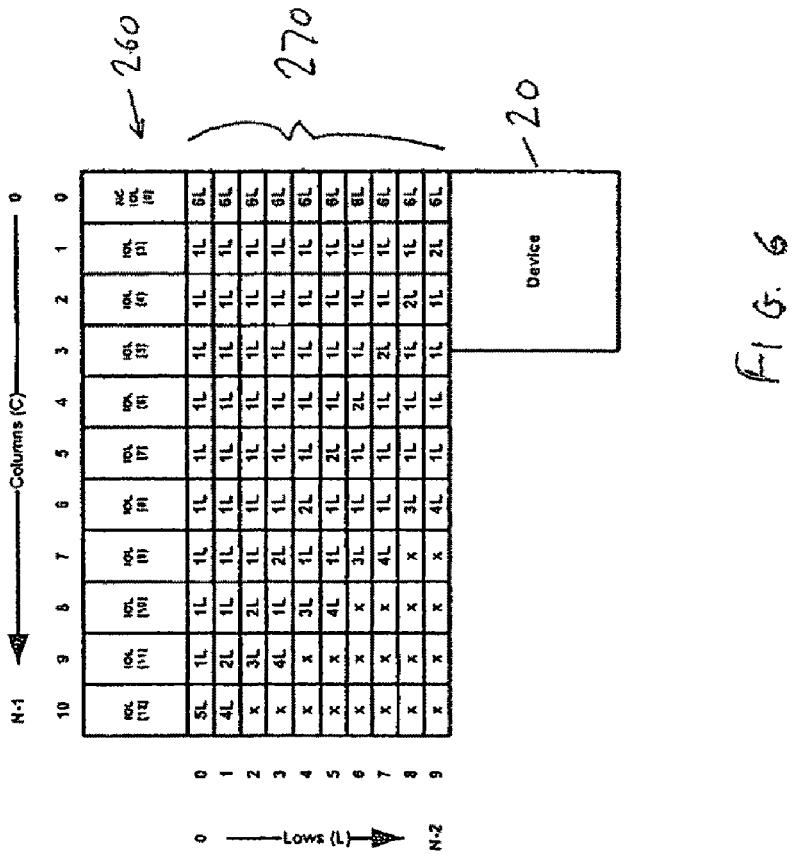
FIG. 6 schematically illustrates a left tree section produced in accordance with one embodiment of the present invention.

There are three type main types of tree configurations. A left branched tree contains only the left tree section while the right tree section is omitted. A left branched tree can contain a corner element. FIG. 6 shows an example of a left branched tree 270 connected directly at the narrow interface of its trunk to the device 20. The IO cells 260 are again shown associated with each column, some of the cells being associated with devices to be connected to data paths of the interconnect circuit (the IOL cells) and other cells being associated with non-connected devices (the NC IOL cells). This left branched tree of the example of FIG. 6 does not have a corner element or a root.

Figure 7:
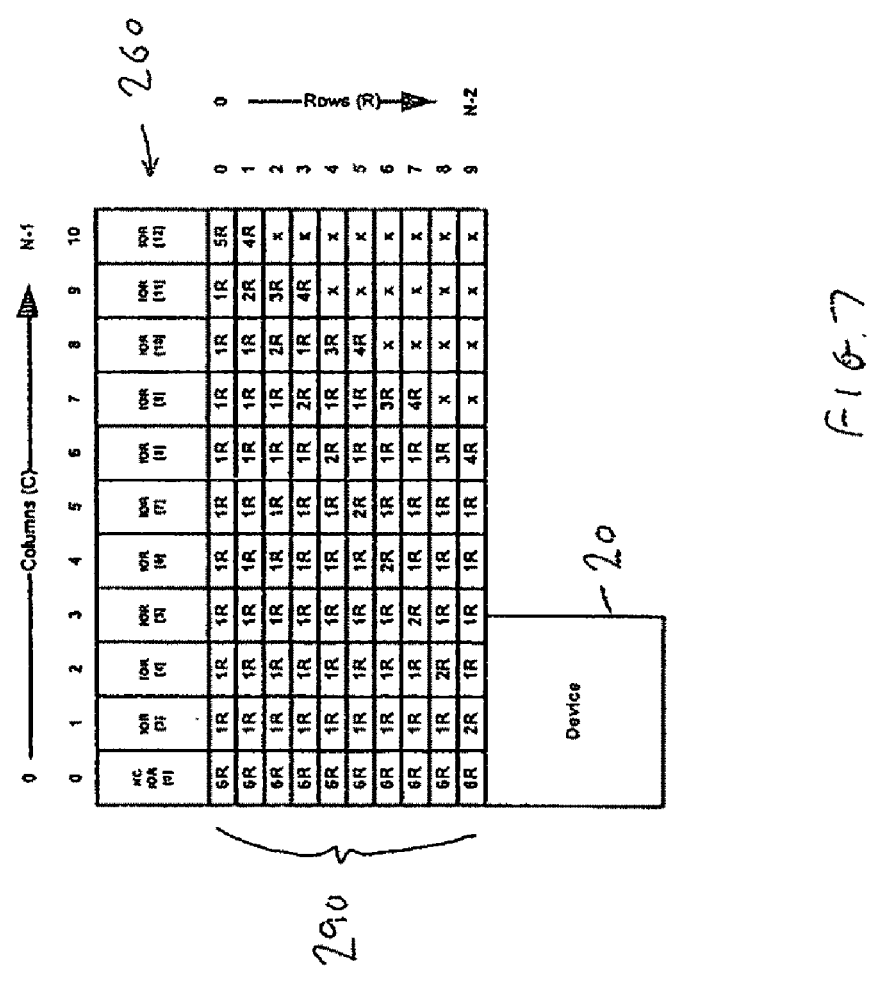

The right branched tree contains a right tree section while the left tree section is omitted. As with a left branched tree, a right branched tree can contain a corner element. FIG. 7 shows an example of a right branched tree 290 which does not have a corner element or a root. Again, in this example, the right branched tree 290 is connected directly at the narrow interface of its trunk to the device 20, and the cells 260 are shown associated with each column.

A balanced tree contains both a left tree section and a right tree section as shown, by way of example, earlier with reference to FIG. 5. A balanced tree can have two corner elements, one on the left tree section and one on the right tree section.

Figure 8:
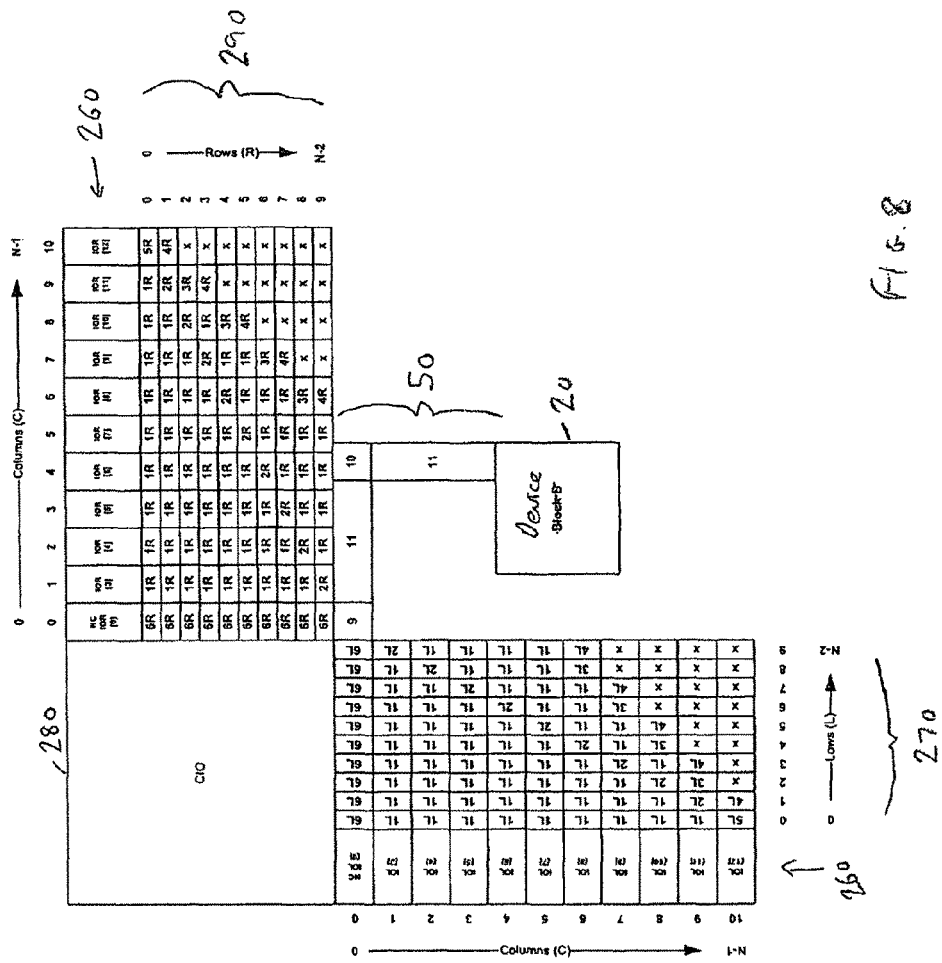
FIG. 8 schematically illustrates a balanced tree structure produced in accordance with one embodiment of the present invention, where the left tree section and right tree section are separated by a corner element.

The angled balanced tree is a special case of the balanced tree which has a corner element between the left tree section and the right tree section. FIG. 8 shows an example of an angled balanced tree. The angled balanced tree can have three corner elements, namely one on the left tree section, one on the right tree section, and one between the left tree section and the right tree section. In the FIG. 8 example, the angled balanced tree has a left tree section 270 separated by a corner 280 from the right tree section 290. The device 20 is separated from the tree by a root 50 formed of tiles 9, 10 and 11. As with the earlier FIGS. 5 to 7, cells 260 are shown associated with each column of the tree, for association with either connected devices or non-connected devices.

Whilst in the above examples, it is indicated that any tree section may have at most one corner element in it, it will be appreciated that in alternative embodiments more than one corner element may be provided within each tree section.

Figure 9:
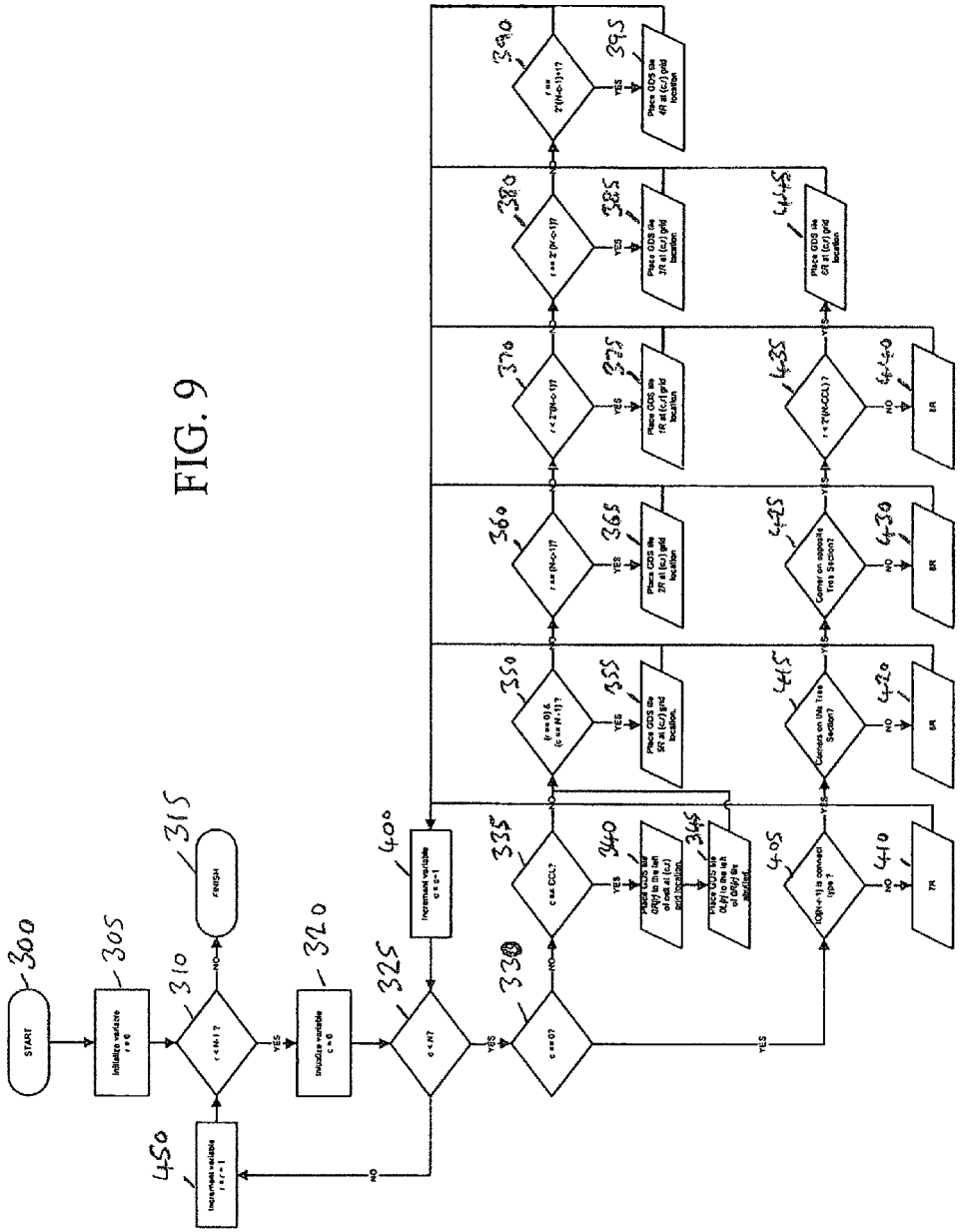
FIG. 9 is a flow diagram schematically illustrating the method employed in accordance with one embodiment of the present invention to produce right tree sections.
Figure 10:
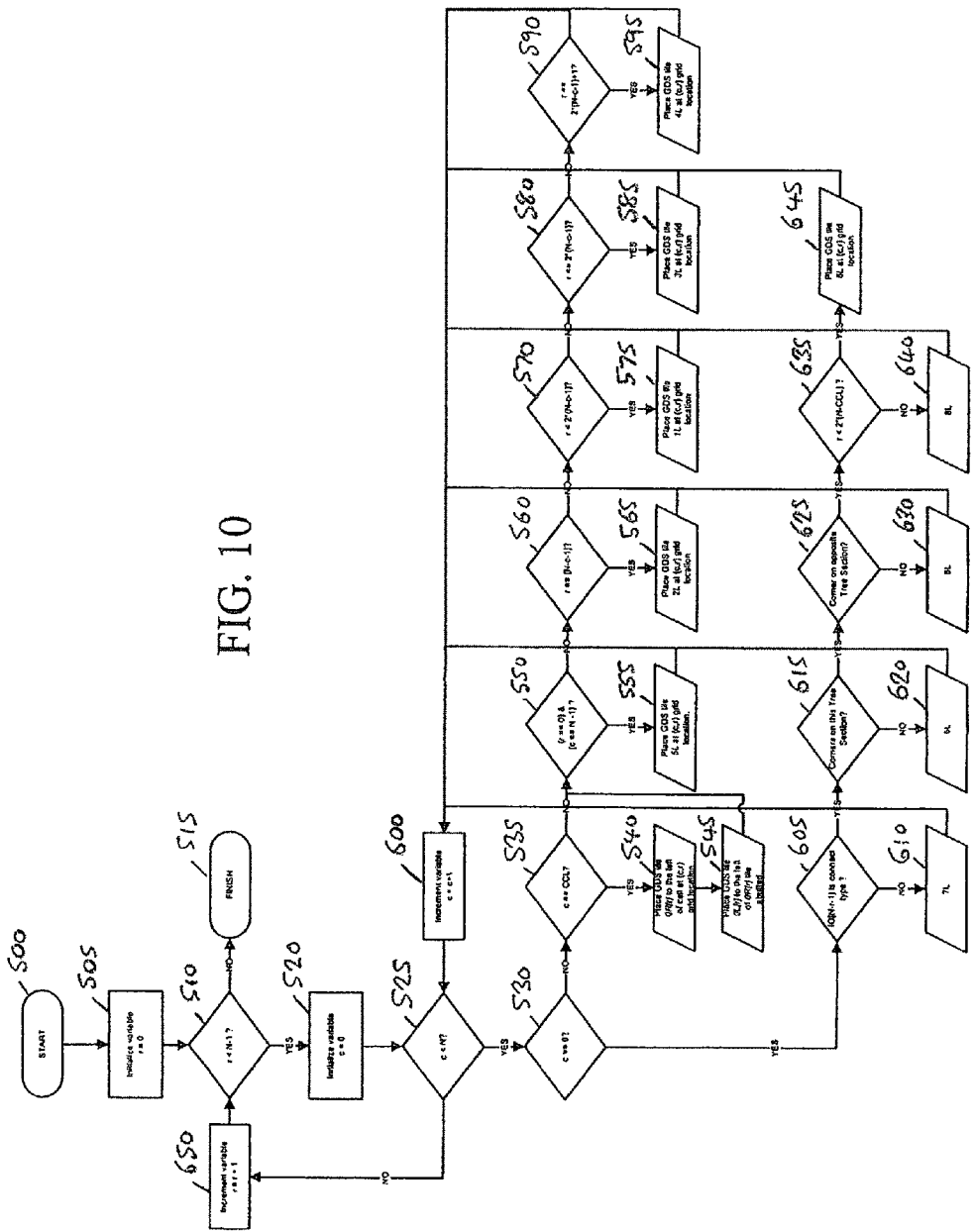
FIG. 10 is a flow diagram schematically illustrating the method employed in accordance with one embodiment of the present invention to produce left tree sections.

FIG. 9 show the flow charts of the algorithm used in one embodiment for building right branched trees. The algorithm is also used to build right tree sections of balanced trees. FIG. 10 shows the flowchart of the algorithm used in one embodiment for building left branched trees. The algorithm is also used to build left tree sections of balanced trees. Both algorithms use the following parameters and variables:

N—Constant for the given configuration whose value represents the number of IO cells that are part connected to via the interconnect circuit.

CCL—Constant for the given configuration whose value represents the IO cell column location after which a corner cell will be instantiated.

c—Variable that contains the selected column location to instantiate a tile.

r—Variable that contains the selected row location to instantiate the tile.

In FIGS. 9 and 10 the tiles are referred to as GDS tiles. The algorithms build trees by specifying the type of tile and its location in the tree by using row r and column c coordinates. The algorithm illustrated in FIGS. 9 and 10 does not instantiate "don't care" tiles if they are used. Left branched trees are built from right to left as shown in FIG. 6. This means that column c=0 is the right most column and column c=N−1 is the left most column. Right branched trees are built from left to right as shown in FIG. 7. This means that column c=0 is the left most column and column c=N−1 is the right most column. The balanced trees are built by placing together a left branched tree and a right branched tree abutted at columns c=0 as shown in FIG. 5, or at a 90° angle as shown in FIG. 8. The tree structures produced for the interconnect circuit using the algorithm illustrated in FIGS. 9 and 10 have the following constraints:

1. All the tiles, IO cells, and device 20 are connected together by abutment.

2. Bit positions for interconnect busses (data paths) must be maintained when abutting elements.

3. The number of columns when building balanced trees for the left tree section and the right tree section must be the same, to ensure the propagation delay is matched.
4. IO Cells associated with columns c=0 must not be associated with devices that require connection to device 20 through the interconnect.
5. Corners are built with 0L and 0R tiles which are not given a column number, but are placed after the tile with (c,r) grid location.

By following the processes defined in FIGS. 9 and 10, right and left tree sections can be formed as shown in the earlier figures. For example, by applying the process of FIG. 9, the right tree section shown in FIG. 7 can be produced. In this example, N=11. Starting at location r=0, c=0, it can be seen that the process proceeds through steps 300, 305, 310, 320, 325, 330, 405 to step 415, where it is determined that there are no corners on this tree section. Accordingly, the process proceeds to step 420, where the tile 6R is inserted at row 0, column 0, whereafter the process passes to step 400. At step 400, the column value c is incremented whereafter the process proceeds via steps 325, 330, 335, 350, 360 to step 370. At this point, the condition specified in step 370 is met, causing the process to branch to step 375 where the tile 1R is placed at column 1, row 0, whereafter the process returns to step 400.

Once the column value has been incremented at step 400 to a value which equates with the value N, then the process branches to step 450 where the row value is incremented and thereafter at step 320 the column value is reset to 0, causing the process to be repeated for all of the block locations of row 1. When it is determined at step 310 that the incremented row value is no longer less than N−1, then the process finishes at step 315.

FIG. 10 illustrates the corresponding process used to produce left tree sections. Hence, for example considering the left tree section of FIG. 6, this tile allocation as shown in FIG. 6 is produced by performing the process of FIG. 10. Purely by way of example, considering the block location at r=5, c=5, it will be seen that from step 525, the process follows path 530, 535, 550 to point 560. At this point, the condition specified at step 560 will be met, since r=5, c=5 and N=11. Accordingly, the process branches to step 565 where the tile 2L is placed at that grid location, as indeed is clearly shown in FIG. 6.

From a similar review of FIGS. 9 and 10 in association with any of FIGS. 5 to 8, it will be seen that the process as described in these figures will produce the tile layouts shown in FIGS. 5 to 8. Due to the wiring layouts provided in each of these tiles, the processes of FIGS. 9 and 10 produce data paths within the interconnect structure that all have the same propagation delay. Further, as will be appreciated from FIGS. 9 and 10, this design layout process requires no evaluation of the layout produced to see if it meets the timing constraints, and hence does not require any of the iterations that are commonly required with prior art EDA tools.

A root structure is not necessary for every interconnect type. Device 20 can directly abut to the tree trunk as shown in FIGS. 6 and 7. In general, roots are built from tiles 9, 10, and 11. Left branched trees, right branched trees, and balanced trees can use tiles 9, 10 and 11 to connect the root to the tree. Angled balanced trees use tile 9 to connect the Root to the tree. Tiles 11 and 12 are used to extend the Root to the location where it abuts with the device 20 as illustrated in as illustrated in FIG. 8.

The interconnect tree structure is built from a set of tiles which when placed together connect though abutment. There are a number of common parameters that describe those tiles:
N—Number of IO. This parameter lists the total number of IO cells which will be part of the IO ring 260.
I—Number of Connected IO. This parameter designates the number of IO cells which require connection to device 20 through the interconnect.
P—Port Width. This parameter designates the maximum number of connections, or bits, which an IO cell will need to propagate to device 20 through the interconnect.
Z—Maximum Required Horizontal Metal Length. This parameter designates the longest of the following:
1. The longest wire required to connect an east port to a west port of any tile.
2. Twice the longest wire required to connect an east port to a west port of any 0R or 0L tile.

V—Maximum Required Vertical Metal Length. This parameter designates the longest wire to connect a north port to a south port of any tile.
H—Tile Height. This parameter designates the minimum height required to support two ports of width P bits on the east or west side of any tile.

Figure 11:
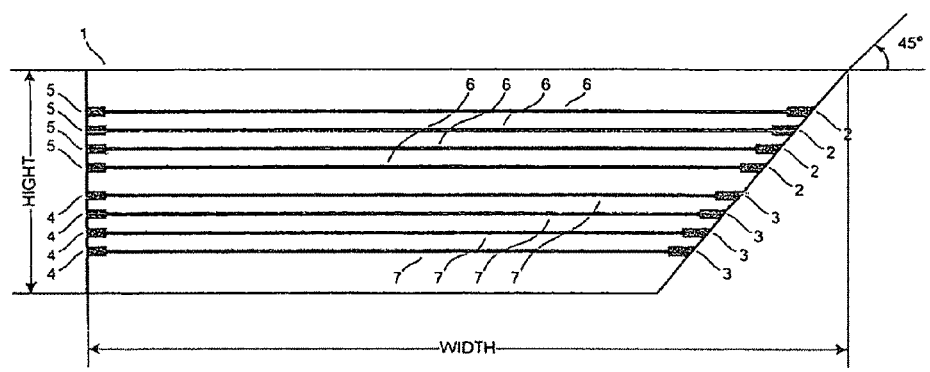
FIGS. 11 to 32 illustrate a predetermined set of tiles used in one embodiment of the present invention.

FIG. 11 is an example of a tile "0L" for illustrative purpose. Most implementations will use multiple metal layers and vias to create ports and interconnect wiring.

The tile has a height of H.
The tile width varies depending on its row location.
All the ports (2, 3, 4 and 5) have P number of connections (bits) each.
Interconnect wiring 6 and 7 have a length of M where, $$M=0.5*Z$$

Figure 12:
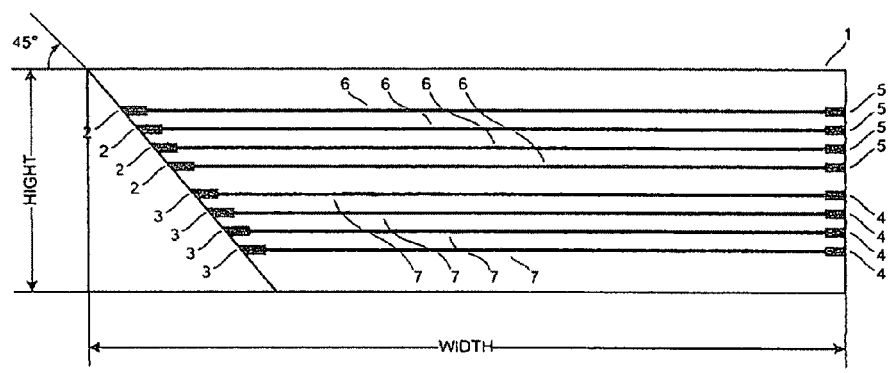

FIG. 12 is an example of a tile "0R" for illustrative purpose. Most implementations will use multiple metal layers and vias to create ports and interconnect wiring.

The tile has a height of H.
The tile width varies depending on its row location and the size of the corner element.
All the ports (2, 3, 4, and 5) have P number of connections (bits) each.
Interconnect wiring 6 and 7 have a length of M where, $$M=0.5*Z$$

The same tile wiring design can be used for type 0L[r] and 0R[r] for a given row r, by using a horizontal flip, if the left and right tiles have equal width.

Figure 13:
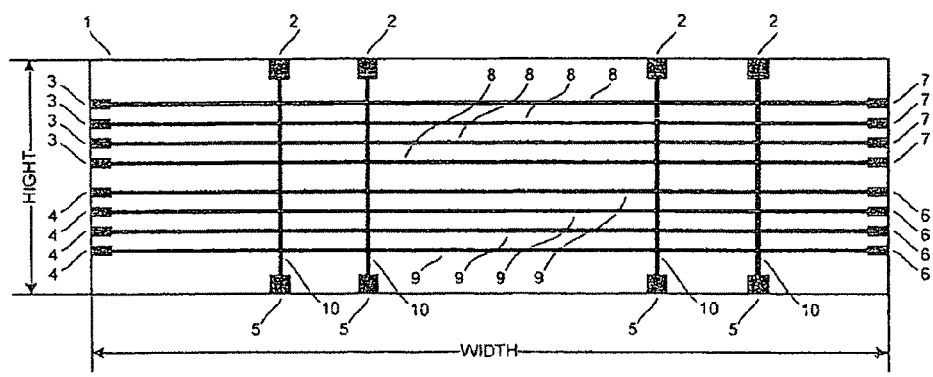

FIG. 13 is an example of a tile "1L" for illustrative purpose. Most implementations will use multiple metal layers and vias to create ports and interconnect wiring.

The tile has height of H.
One tile will be built for each IO cell width used in the interconnect circuitry including IO cells with no connections to device 20.
All the ports (2, 3, 4, 5, 6, and 7) have P number of connections (bits) each.
Interconnect wiring 8 and 9 have a length of M where, $$M=Z$$

Figure 14:
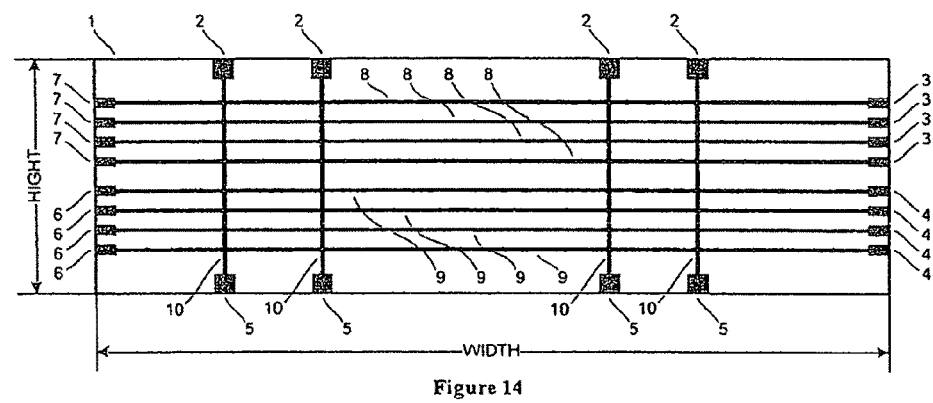

Interconnect wiring 10 has a length of V.
FIG. 14 is an example of a tile "1R" for illustrative purpose. Most implementations will use multiple metal layers and vias to create ports and interconnect wiring.

The tile has height of H.
One tile will be built for each IO cell width used in the interconnect circuitry.
All the ports (2, 3, 4, 5, 6, and 7) have P number of connections (bits) each.
Interconnect wiring 8 and 9 have a length of M where, $$M=Z$$

Interconnect wiring 10 has a length of V.

The same tile wiring design can be used for type 1L and 1R by using a horizontal flip, if the ports on the north and south side have vertical symmetry.

Figure 15:
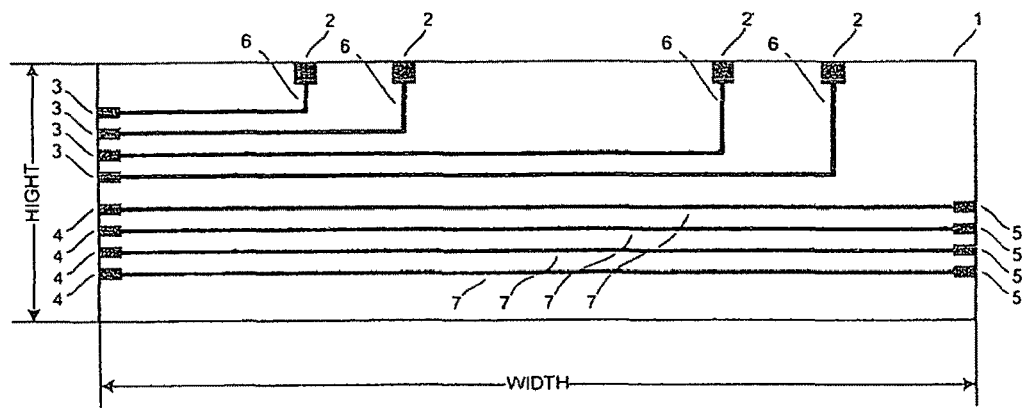

FIG. 15 is an example of a tile "2L" for illustrative purpose. Most implementations will use multiple metal layers and vias to create ports and interconnect wiring.

The tile has height of H.

One tile will be built for each IO cell width used in the interconnect circuitry.

All the ports (2, 3, 4, and 5) have P number of connections (bits) each.

Interconnect wiring 6 has a length of M where, $$M=0.5*Z+0.5*V$$

Interconnect wiring 7 has a length of M where, $$M=Z$$

Figure 16:
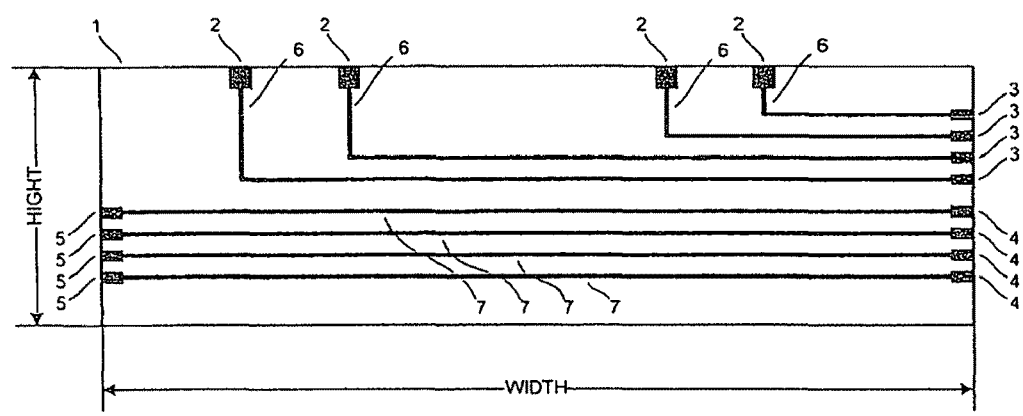

FIG. 16 is an example of a tile "2R" for illustrative purpose. Most implementations will use multiple metal layers and vias to create ports and interconnect wiring.

The tile has height of H.

One tile will be built for each IO cell width used in the interconnect circuitry.

All the ports (2, 3, 4, and 5) have P number of connections (bits) each.

Interconnect wiring 6 has a length of M where, $$M=0.5*Z+0.5*V$$

Interconnect wiring 7 has a length of M where, $$M=Z$$

The same tile wiring design can be used for type 2L and 2R by using a horizontal flip if the ports on the north side have vertical symmetry.

Figure 17:
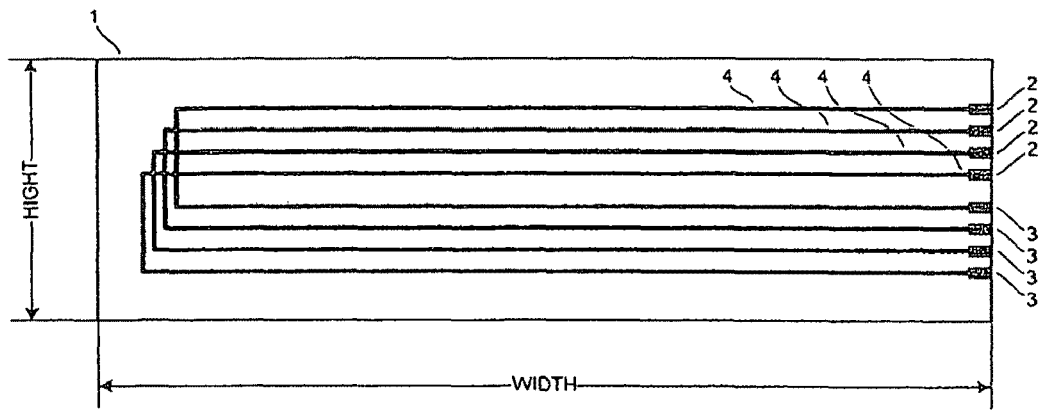

FIG. 17 is an example of a tile "3L" for illustrative purpose. Most implementations will use multiple metal layers and vias to create ports and interconnect wiring.

The tile has height of H.

One tile will be built for each IO cell width used in the interconnect circuitry.

All the ports (2 and 3) have P number of connections (bits) each.

Interconnect wiring 4 has a length of M where, $$M=2*Z+0.5*V$$

Figure 18:
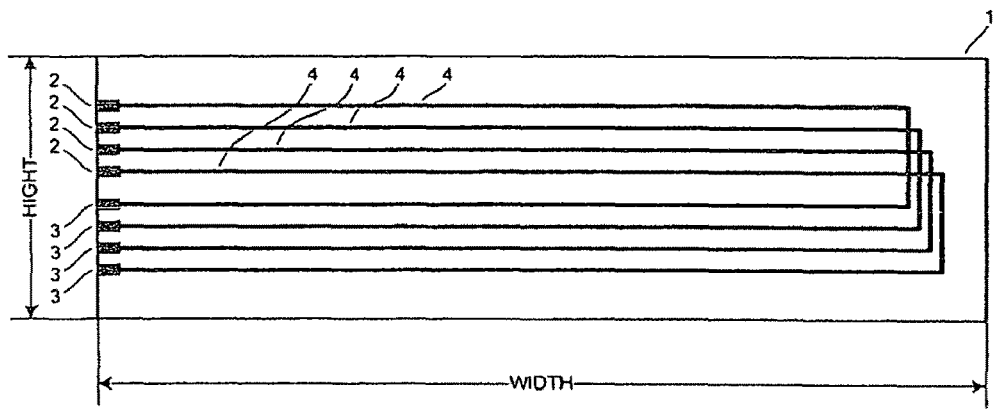

FIG. 18 is an example of a tile "3R" for illustrative purpose. Most implementations will use multiple metal layers and vias to create ports and interconnect wiring.

The tile has height of H.

One tile will be built for each IO cell width used in the interconnect circuitry.

All the ports (2 and 3) have P number of connections (bits) each.

Interconnect wiring 4 has a length of M where, $$M=2*Z+0.5*V$$

The same tile wiring design can be used for type 3L and 3R by using a horizontal flip.

Figure 19:
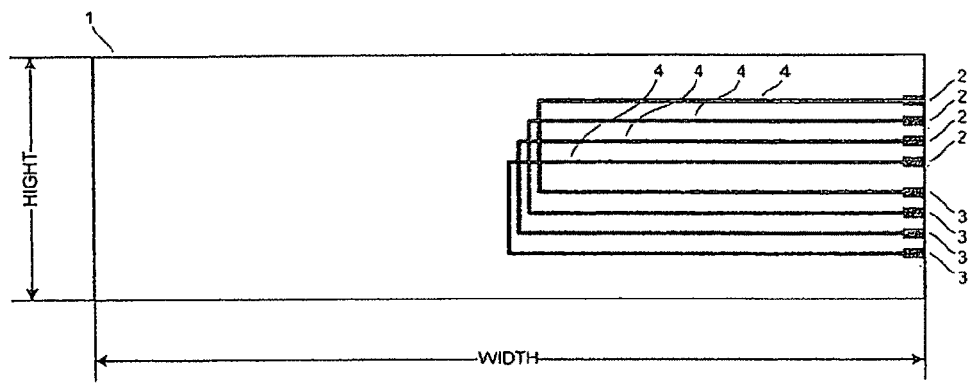

FIG. 19 is an example of a tile "4L" for illustrative purpose. Most implementations will use multiple metal layers and vias to create ports and interconnect wiring.

The tile has height of H.

One tile will be built for each IO cell width used in the interconnect circuitry.

All the ports (2 and 3) have P number of connections (bits) each.

Interconnect wiring 4 has a length of M where, $$M=Z+0.5*V$$

Figure 20:
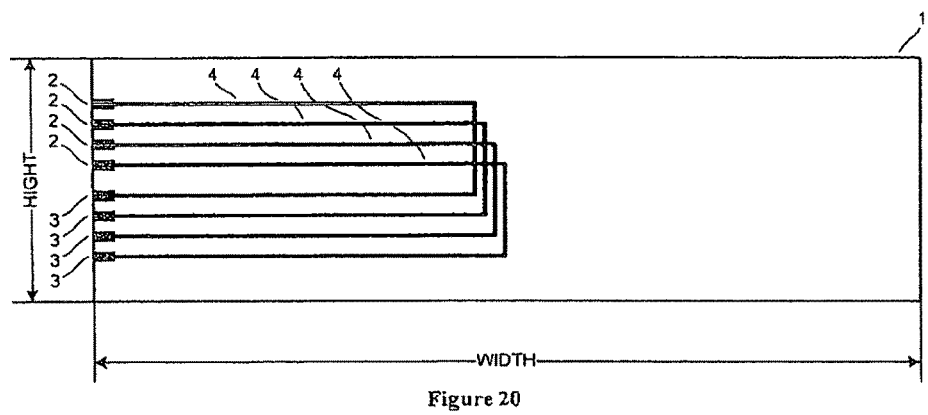

FIG. 20 is an example of a tile "4R" for illustrative purpose. Most implementations will use multiple metal layers and vias to create ports and interconnect wiring.

The tile has height of H.

One tile will be built for each IO cell width used in the interconnect circuitry.

All the ports (2 and 3) have P number of connections (bits) each.

Interconnect wiring 4 has a length of M where, $$M=Z+0.5*V$$

The same tile wiring design can be used for type 4L and 4R by using a horizontal flip.

Figure 21:
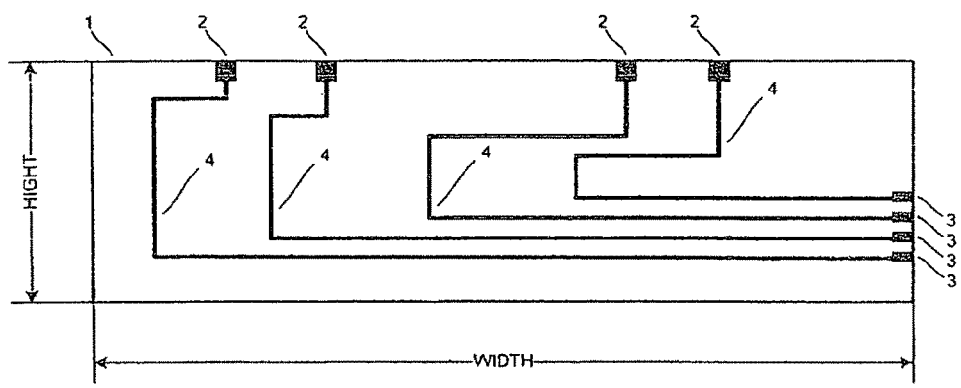

FIG. 21 is an example of a tile "5L" for illustrative purpose. Most implementations will use multiple metal layers and vias to create ports and interconnect wiring.

The tile has height of H.

One tile will be built for each IO cell width used in the interconnect circuitry.

All the ports (2 and 3) have P number of connections (bits) each.

Interconnect wiring 4 has a length of M where, $$M=1.5Z+0.5*V$$

Figure 22:
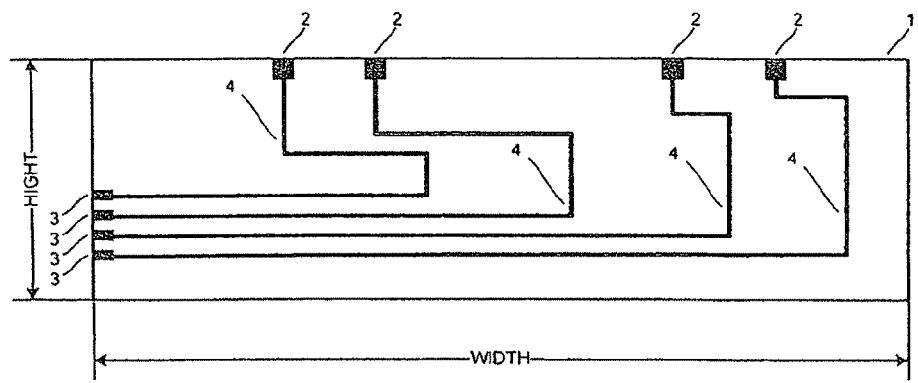

FIG. 22 is an example of a tile "5R" for illustrative purpose. Most implementations will use multiple metal layers and vias to create ports and interconnect wiring.

The tile has height of H.

One tile will be built for each IO cell width used in the interconnect circuitry.

All the ports (2 and 3) have P number of connections (bits) each.

Interconnect wiring 4 has a length of M where, $$M=1.5Z+0.5*V$$

The same tile wiring design can be used for type 5L and 5R by using a horizontal flip if the ports on the north side have vertical symmetry.

Figure 23:
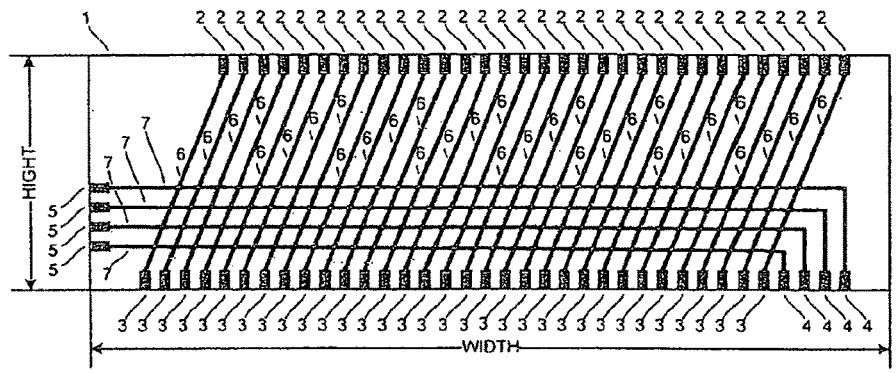

FIG. 23 is an example of a tile "6L" for illustrative purpose. Most implementations will use multiple metal layers and vias to create ports and interconnect wiring.

The tile has height of H.

The tile width is the same as the IO cell width on the tree trunk.

Ports 2 and 3 have S number of connections where, $$S>=(I-1)*P$$

Ports 4 and 5 have S number of connections where, $$S=P$$

Interconnect wiring 6 has a length of M where, $$M=V$$

Interconnect wiring 7 has a length of M where, $$M=Z+0.5*V$$

Figure 24:
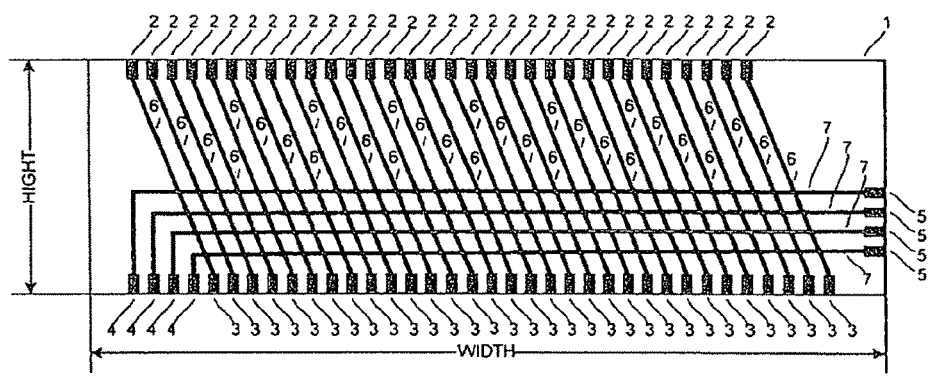

FIG. 24 is an example of a tile "6R" for illustrative purpose. Most implementations will use multiple metal layers and vias to create ports and interconnect wiring.

The tile has height of H.

The tile width is the same as the IO cell width on the tree trunk.

Ports 2 and 3 have S number of connections where, $$S>=(I-1)*P$$

Ports 4 and 5 have S number of connections where, $$S=P$$

Interconnect wiring 6 has a length of M where, $$M=V$$

Interconnect wiring 7 has a length of M where, $$M=Z+0.5*V$$

The same tile wiring design can be used for type 6L and 6R by using a horizontal flip.

Figure 25:
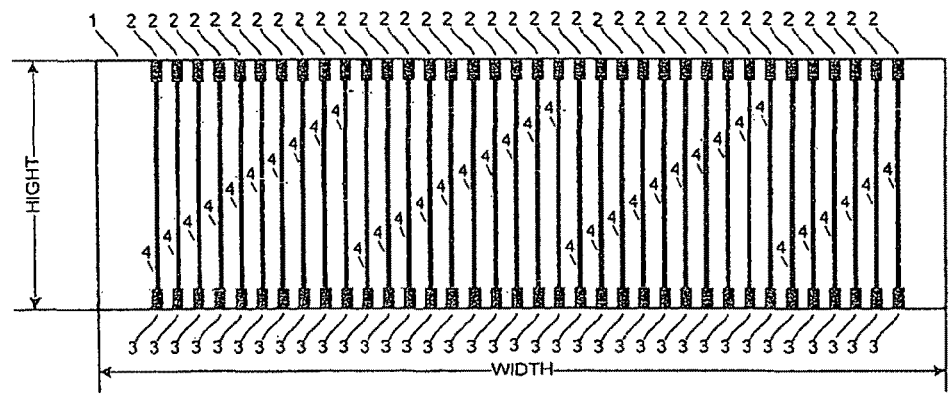

FIG. 25 is an example of a tile "7L" for illustrative purpose. Most implementations will use multiple metal layers and vias to create ports and interconnect wiring.

The tile has height of H.

The tile width is the same as the IO cell width on the tree trunk.

Ports 2 and 3 have S number of connections where, $$S>=I*P$$

Interconnect wiring 4 has a length of M where, $$M=V$$

Figure 26:
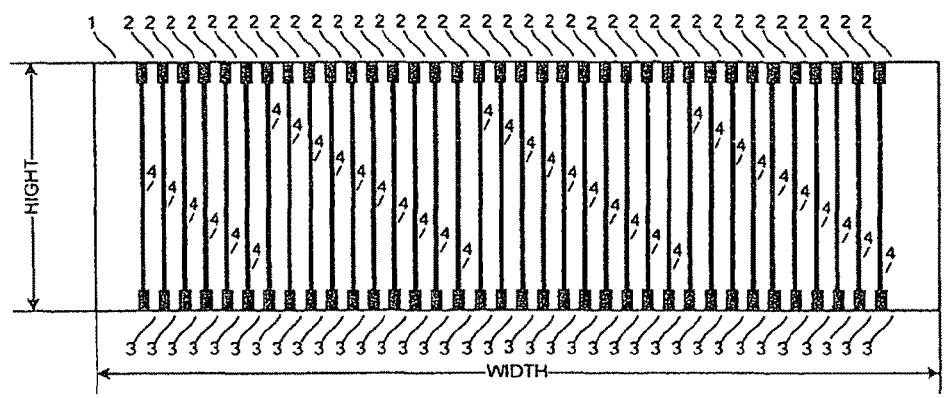

FIG. 26 is an example of a tile "7R" for illustrative purpose. Most implementations will use multiple metal layers and vias to create ports and interconnect wiring.

The tile has height of H.

The tile width is the same as the IO cell width on the tree trunk.

Ports 2 and 3 have S number of connections where, $$S>=I*P$$

Interconnect wiring 4 has a length of M where, $$M=V$$

The same tile wiring design can be used for type 7L and 7R by using a horizontal flip.

Figure 27:
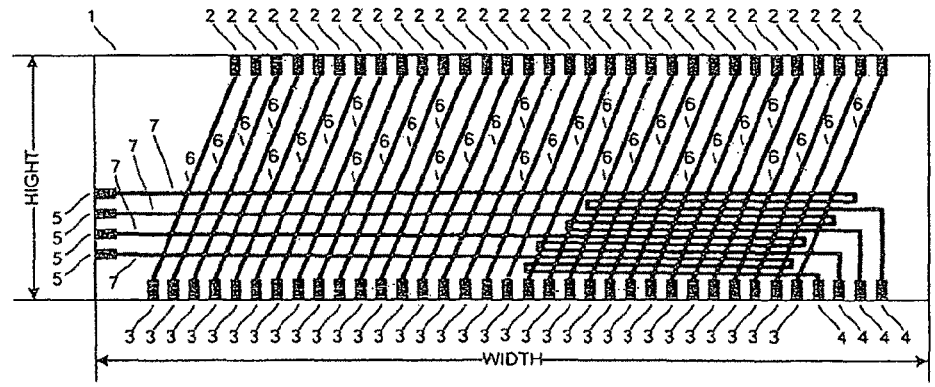

FIG. 27 is an example of a tile "8L" for illustrative purpose. Most implementations will use multiple metal layers and vias to create ports and interconnect wiring.

The tile has height of H.

The tile width is the same as the IO cell width on the tree trunk.

Ports 2 and 3 have S number of connections where, $$S>=(I-1)*P$$

Ports 4 and 5 have S number of connections where, $$S=P$$

Interconnect wiring 6 has a length of M where, $$M=V$$

Interconnect wiring 7 has a length of M where, $$M=2*Z+0.5*V$$

Figure 28:
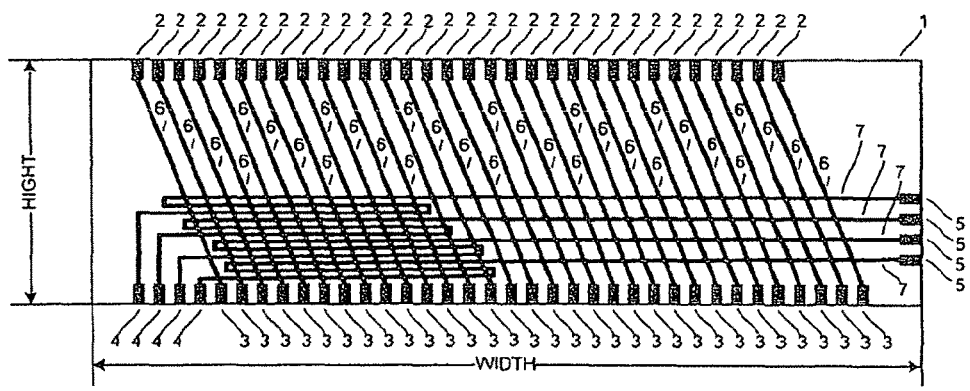

FIG. 28 is an example of a tile "8R" for illustrative purpose. Most implementations will use multiple metal layers and vias to create ports and interconnect wiring.

The tile has height of H.

The tile width is the same as the IO cell width on the tree trunk.

Port 2 and 3 have S number of connections where, $$S>=(I-1)*P$$

Ports 4 and 5 have S number of connections where, $$S=P$$

Interconnect wiring 6 has a length of M where, $$M=V$$

Interconnect wiring 7 has a length of M where, $$M=2*Z+0.5*V$$

The same tile wiring design can be used for type 8L and 8R by using a horizontal flip.

Figure 29:
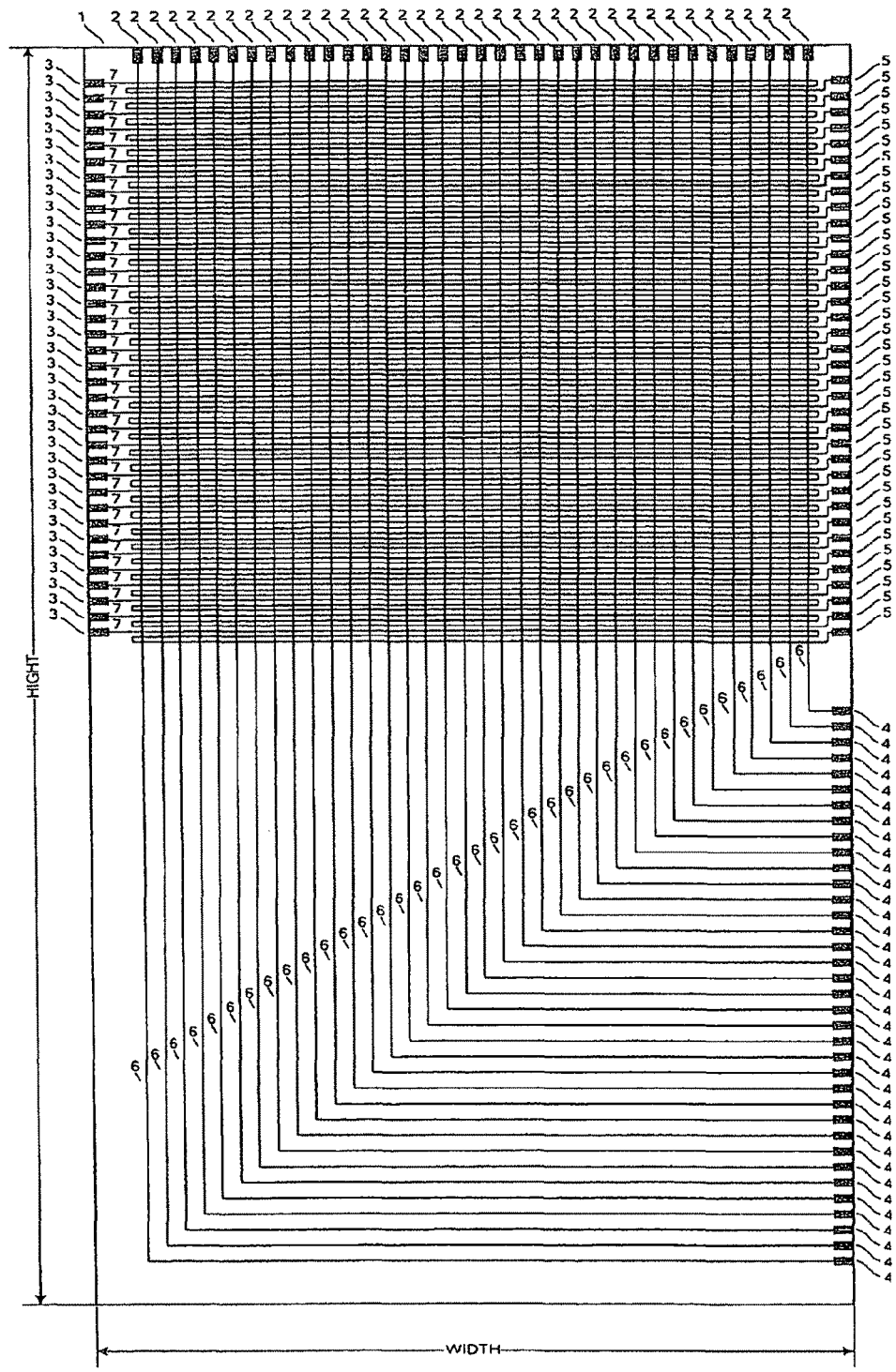

FIG. 29 is an example of a tile "9L" for illustrative purpose. Most implementations will use multiple metal layers and vias to create ports and interconnect wiring.

The tile has height of T where,
if X is the IO cell width on the tree trunk.

$$T=2*X$$

The tile has width of U where,
if X is the IO cell width on the tree trunk.

$$U=X$$

Ports 2, 3, 4 and 5 have S number of connections where, $$S>=(I-1)*P$$

Interconnect wiring 6 and 7 have length of M, where M can be any value preferably the minimum length possible for the tile.

Figure 30:
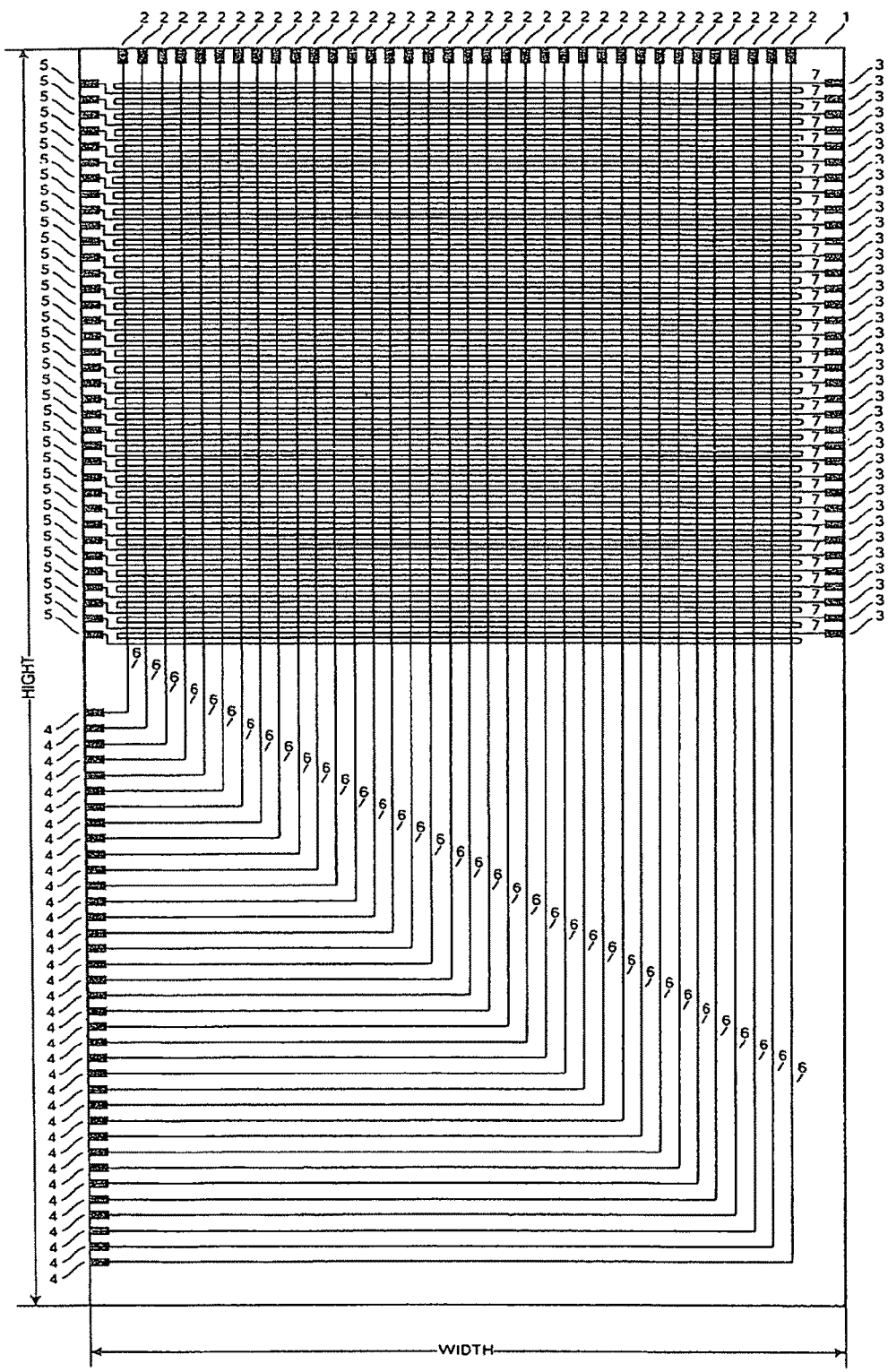

FIG. 30 is an example of a tile "9R" for illustrative purpose. Most implementations will use multiple metal layers and vias to create ports and interconnect wiring.

The tile has height of T where,
if X is the IO cell width on the tree trunk.

$$T=2*X$$

The tile has width of U where,
if X is the IO cell width on the tree trunk.

$$U=X$$

Ports 2, 3, 4 and 5 have S number of connections where, $$S>=(I-1)*P$$

Interconnect wiring 6 and 7 have length of M, where M can be any value preferably the minimum length possible for the tile.

The same tile wiring design can be used for type 9L and 9R by using a horizontal flip.

Figure 31:
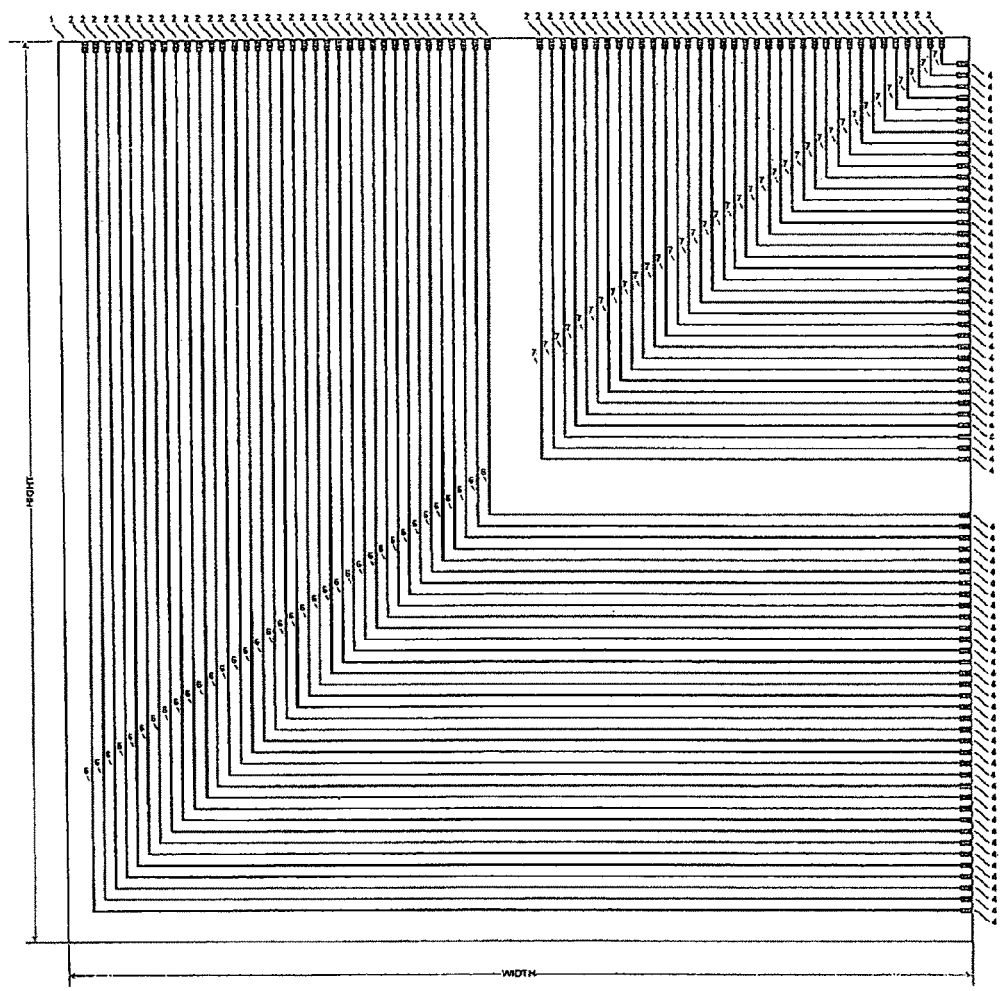

FIG. 31 is an example of a tile "10" for illustrative purpose. Most implementations will use multiple metal layers and vias to create ports and interconnect.

The tile has height of T where,
if X is the IO cell width on the tree trunk.

$$T=2*X$$

The tile has width of U where,
if X is the IO cell width on the tree trunk.

$$U=2*X$$

Ports 2, 3, 4 and 5 have S number of connections where, $$S>=(I-1)*P$$

Interconnect wiring 6 and 7 have length of M, where M can be any value preferably the minimum length possible for the tile.

tile 10 can be rotated and flipped to fit the application.

Figure 32:
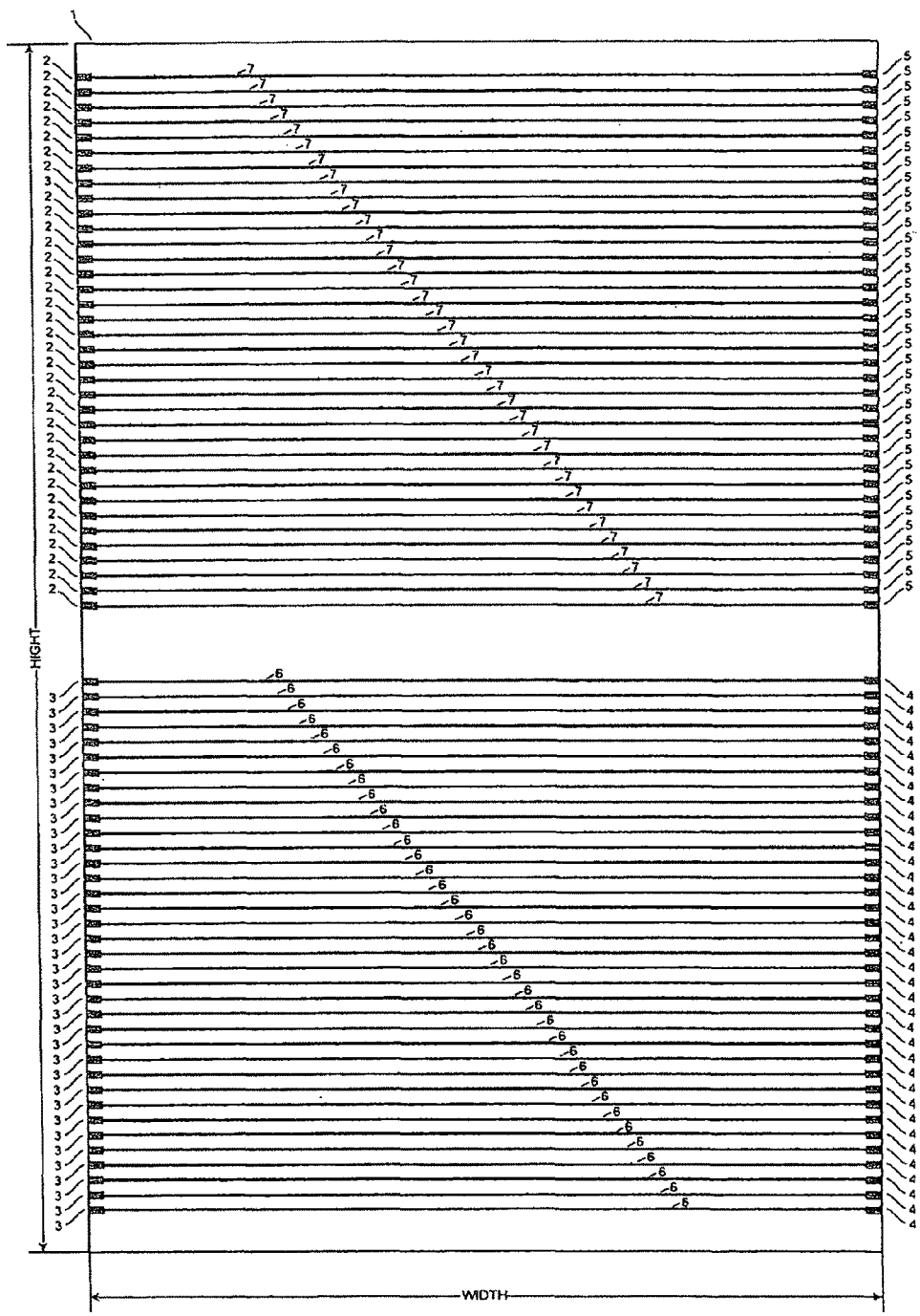
Figure 33:
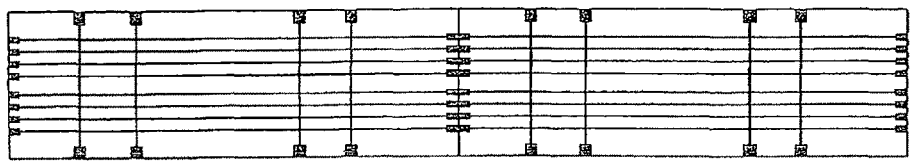
FIGS. 33 to 69 illustrate how different tiles connect by abutment in accordance with one embodiment of the present invention.
Figure 34:
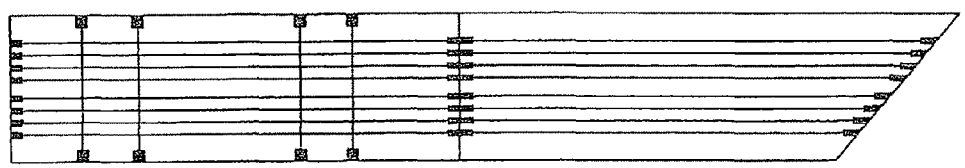
Figure 35:
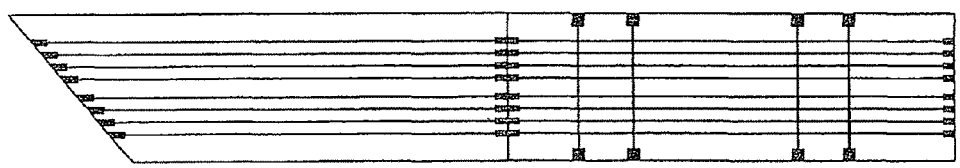
Figure 36:
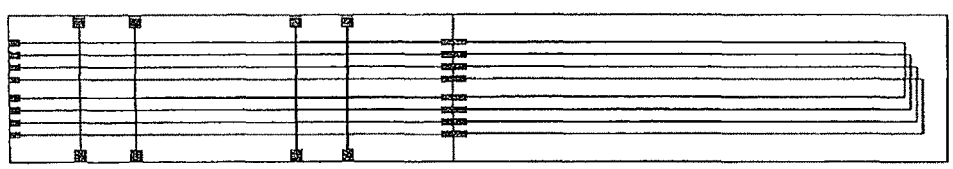
Figure 37:
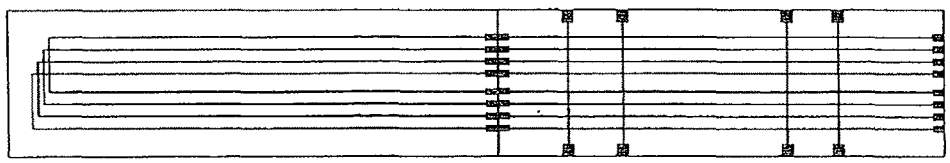
Figure 38:
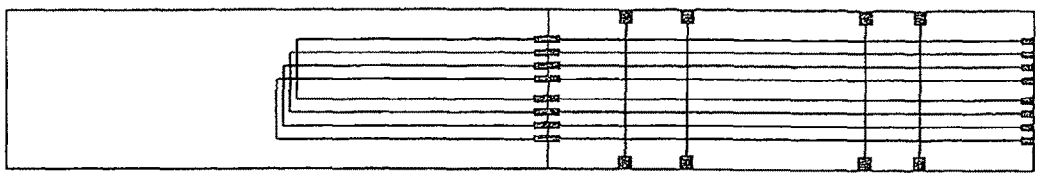
Figure 39:
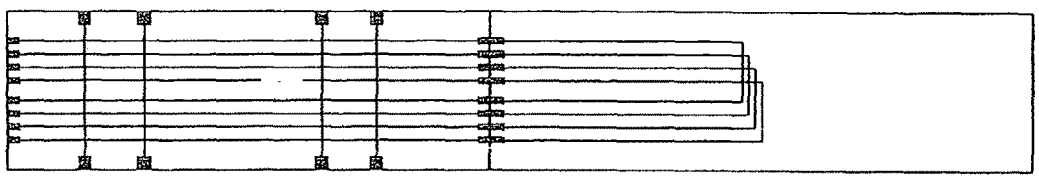
Figure 40:
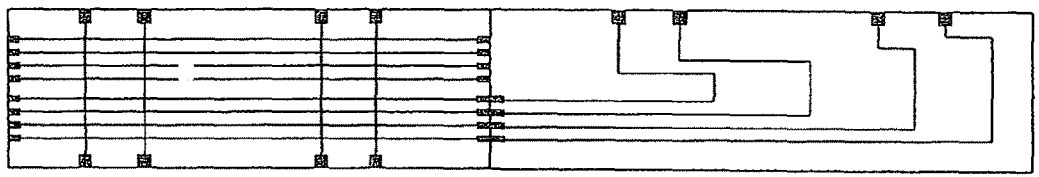
Figure 41:
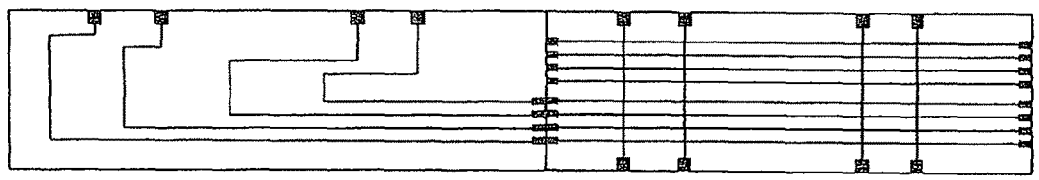
Figure 42:
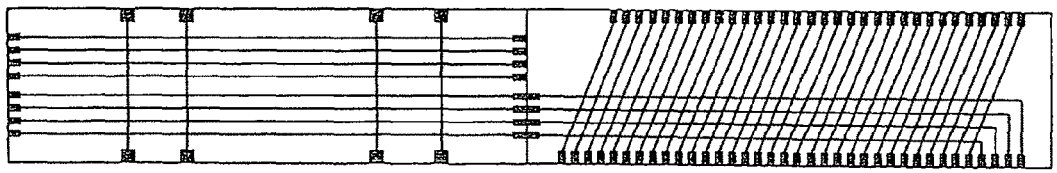
Figure 43:
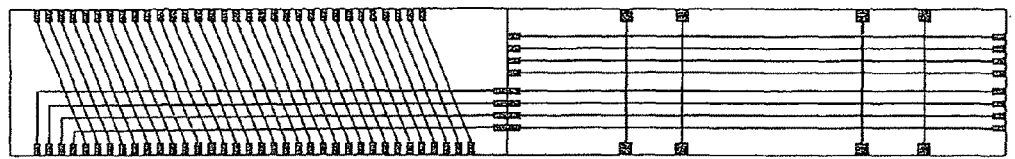
Figure 44:
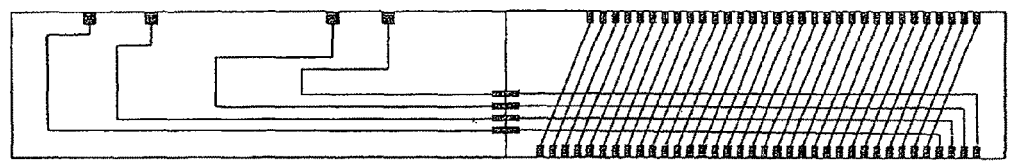
Figure 45:
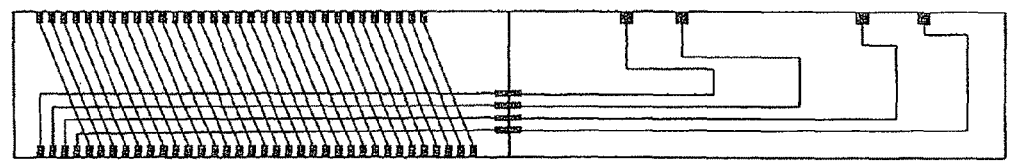
Figure 46:
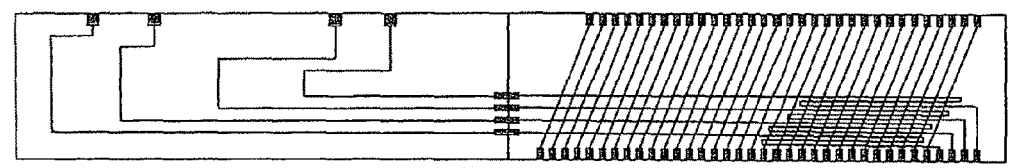
Figure 47:
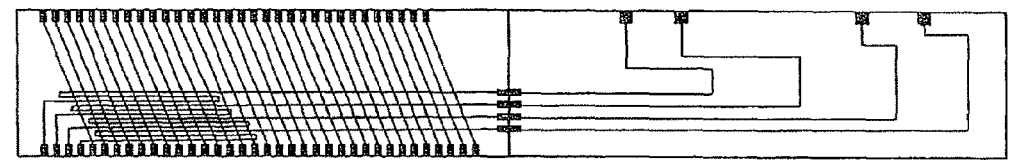
Figure 48:
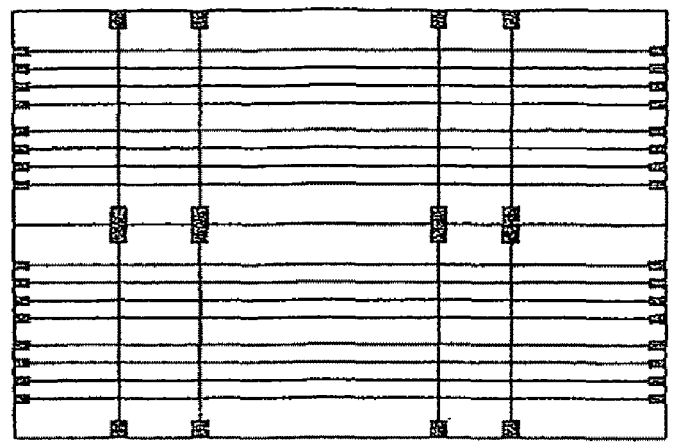
Figure 49:
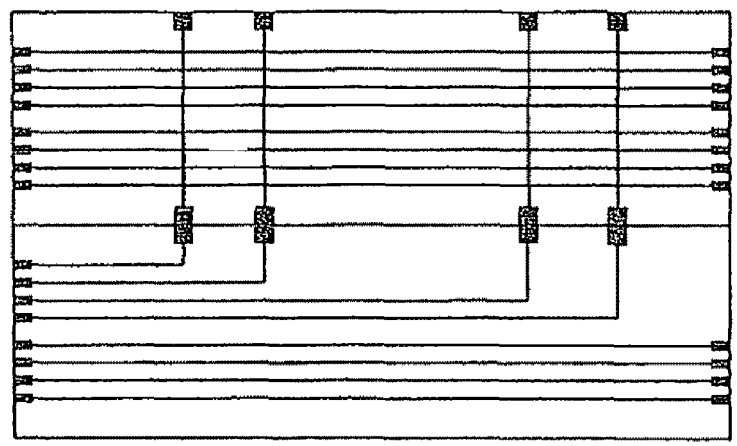
Figure 50:
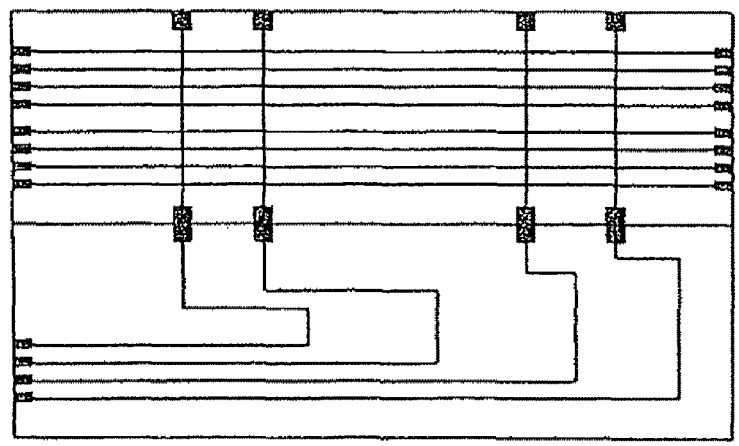
Figure 51:
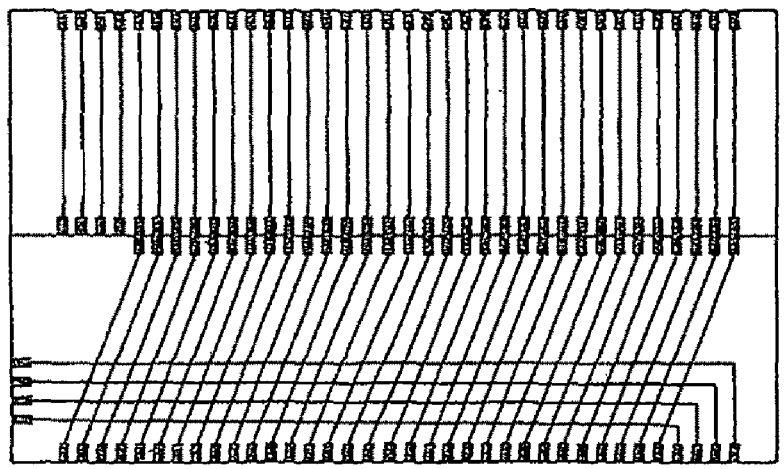
Figure 52:
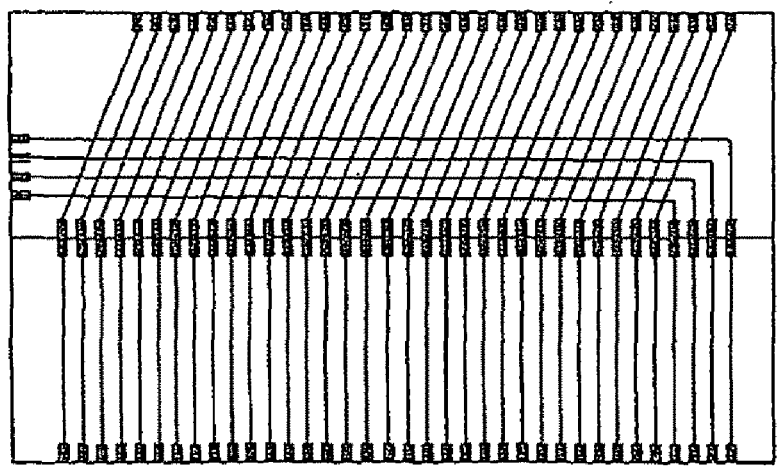
Figure 53:
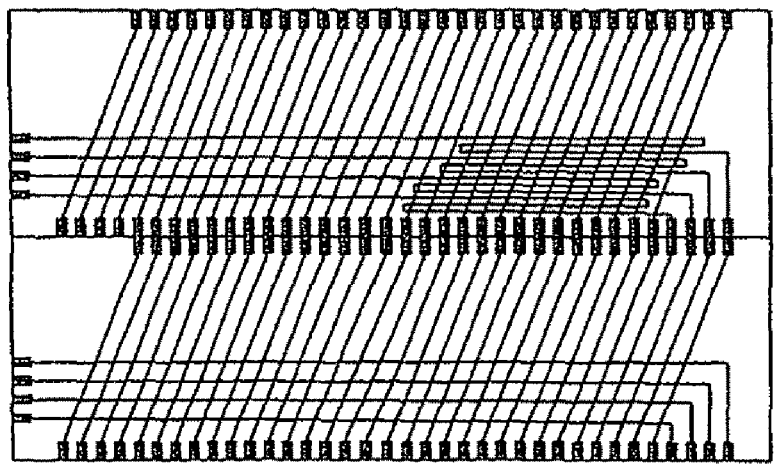
Figure 54:
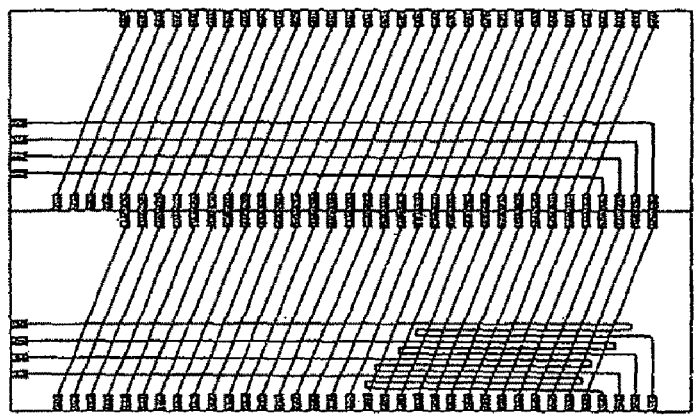
Figure 55:
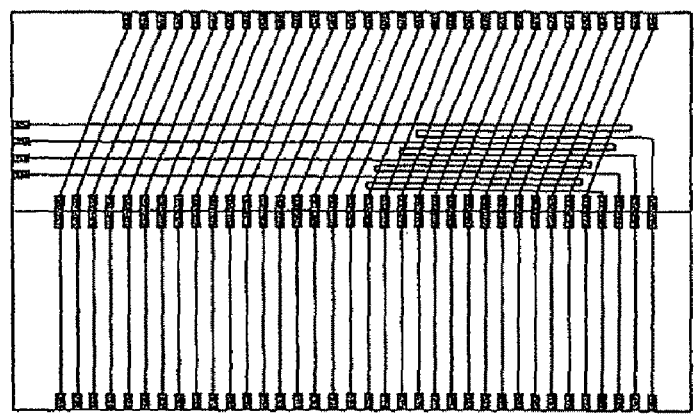
Figure 56:
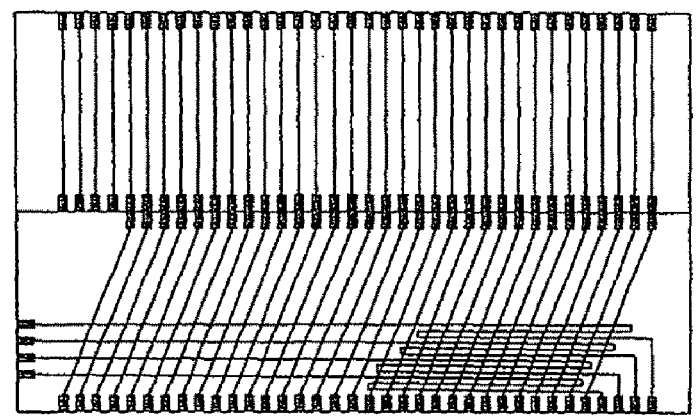
Figure 57:
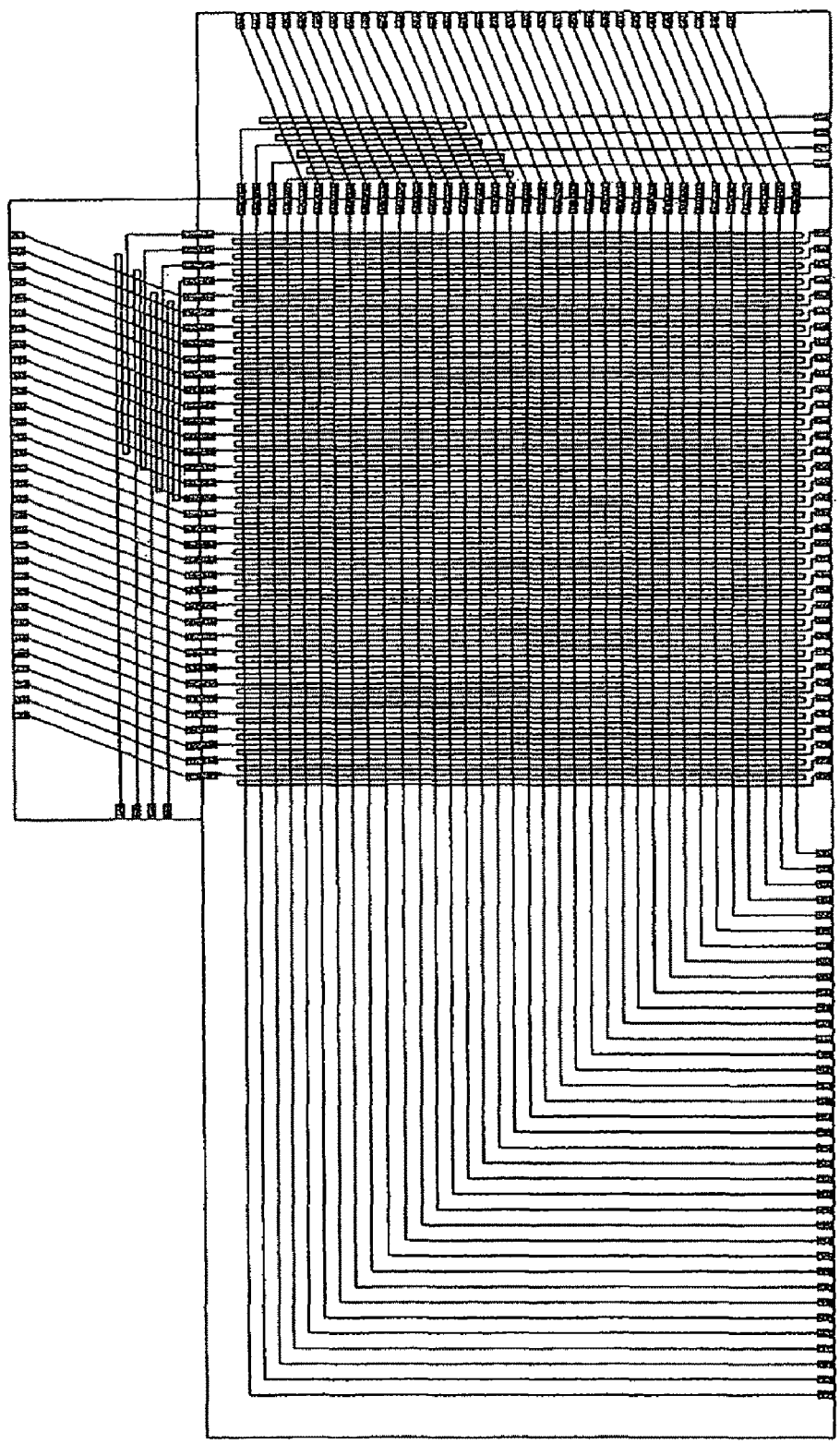
Figure 58:
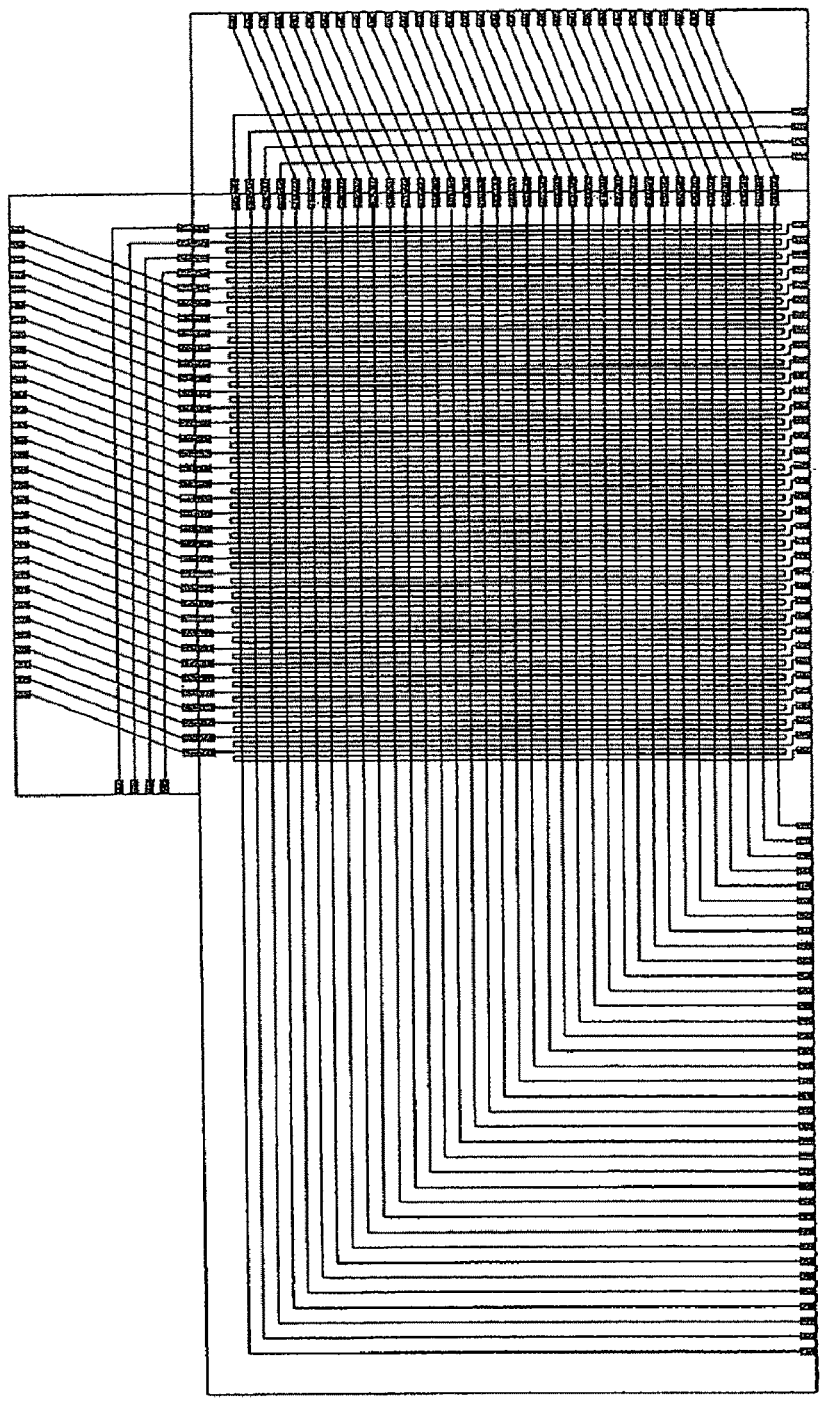
Figure 59:
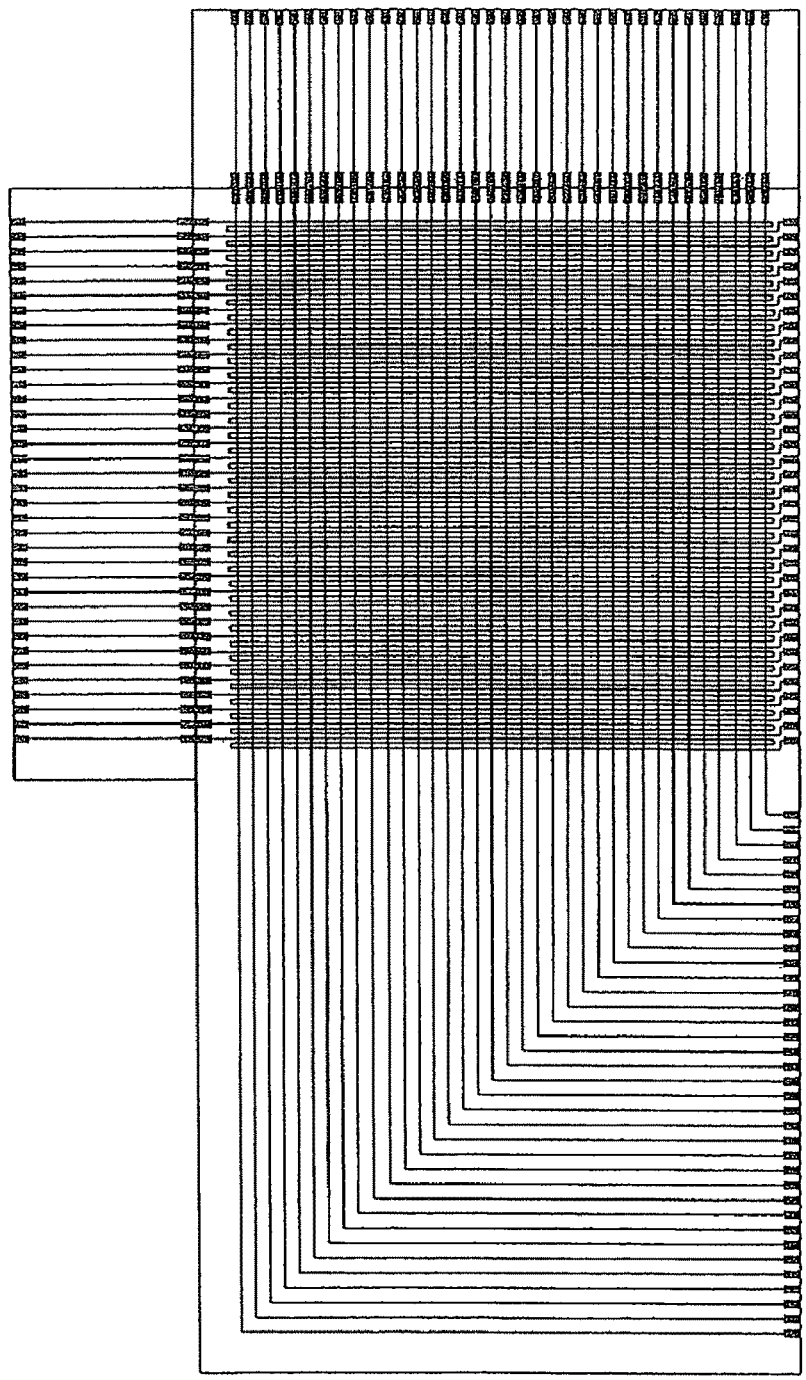
Figure 60:
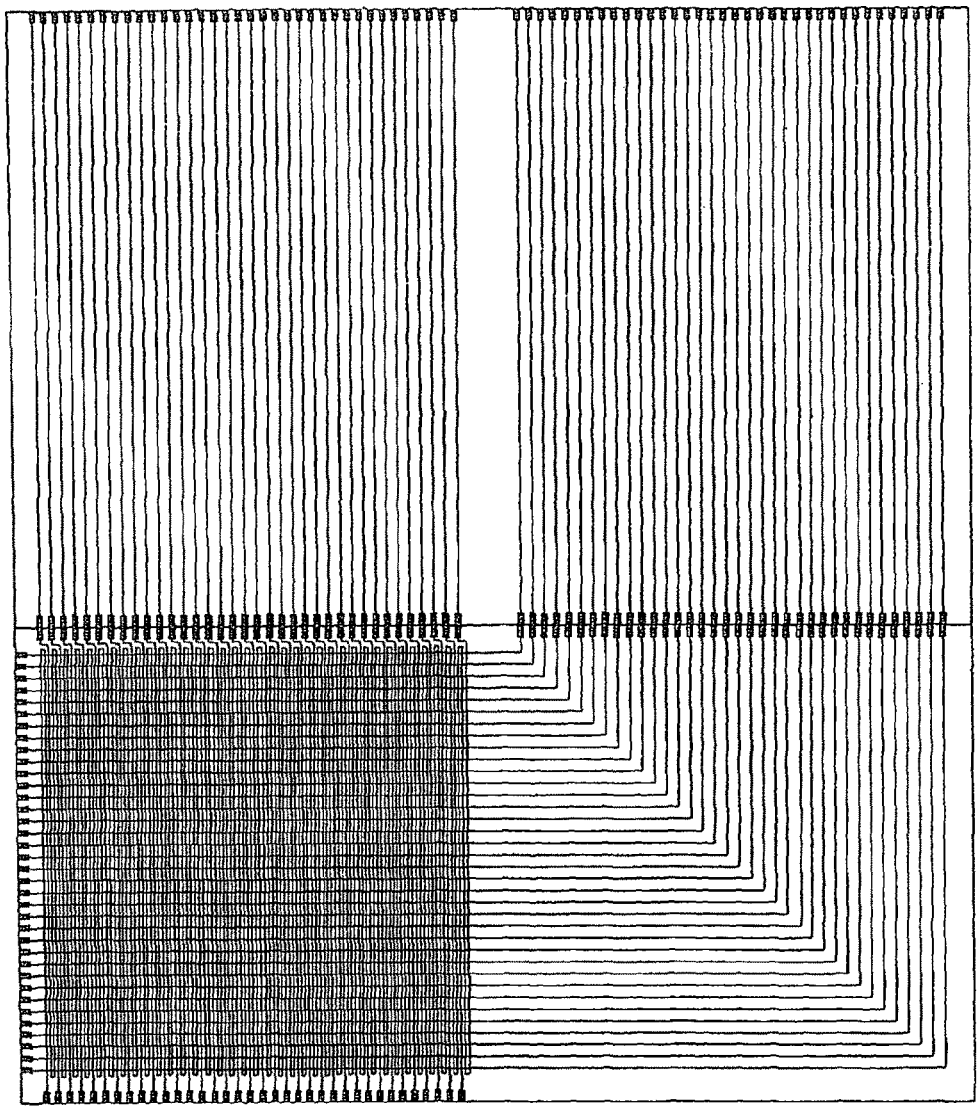
Figure 61:
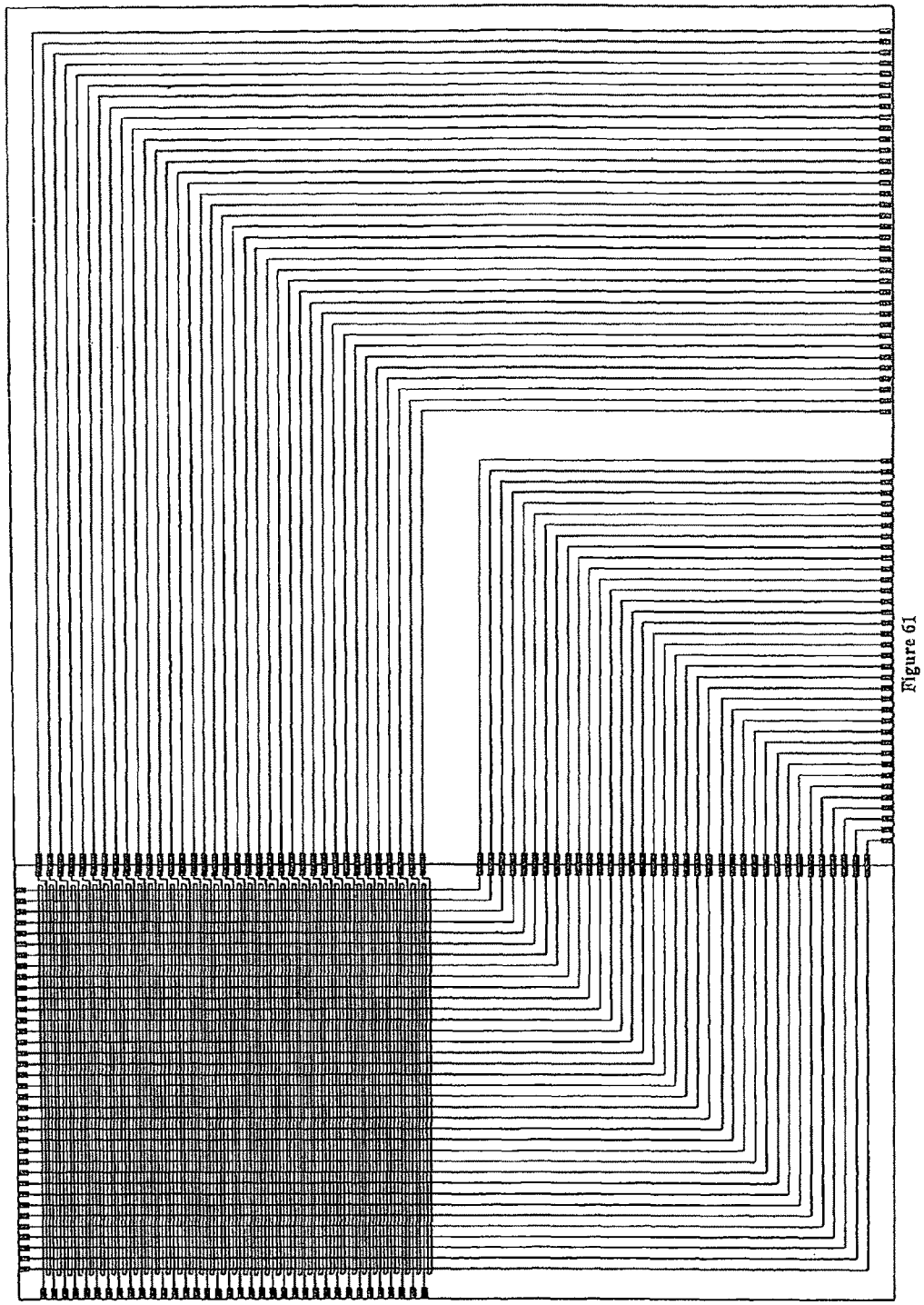
Figure 62:
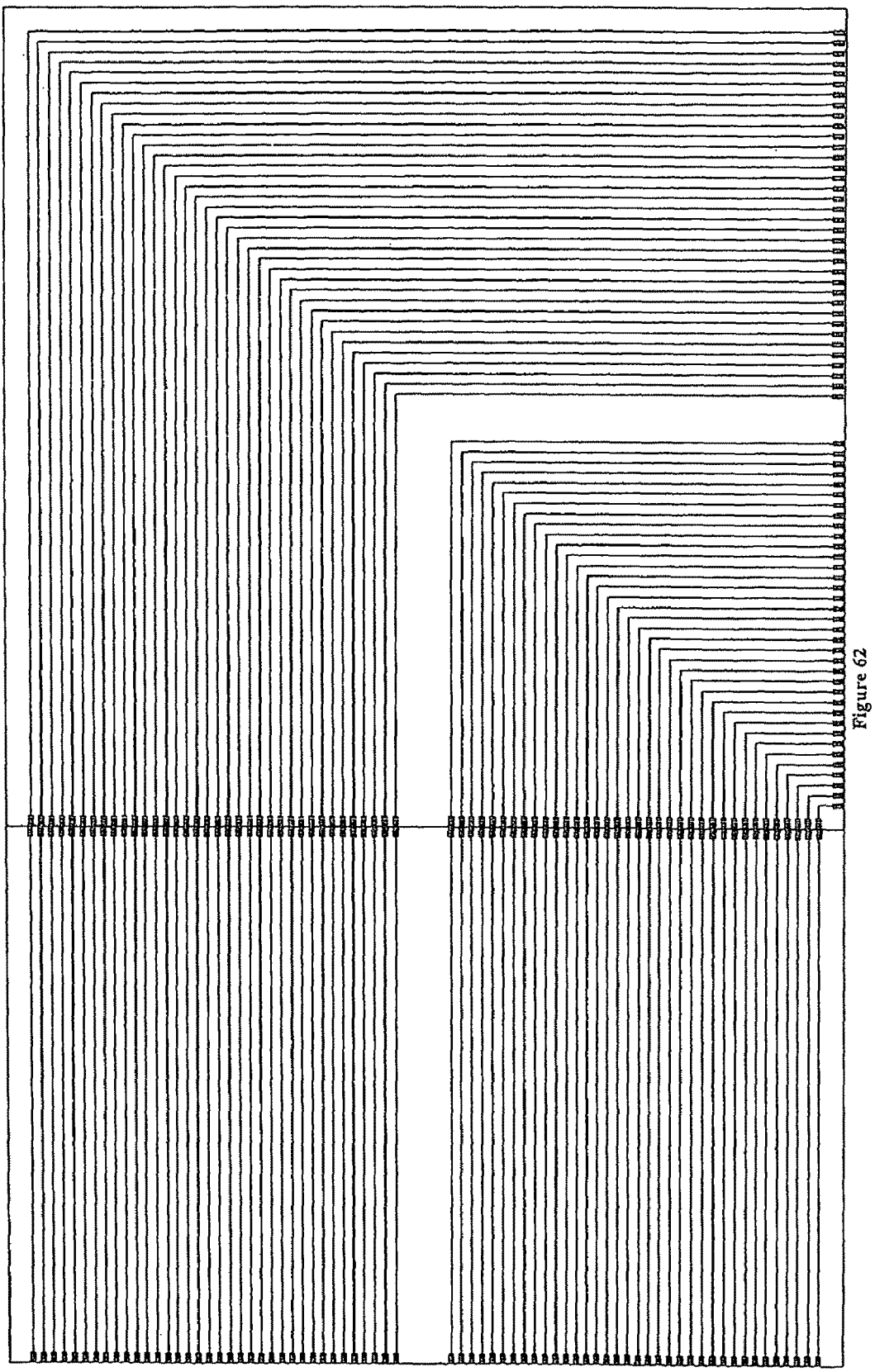
Figure 63:
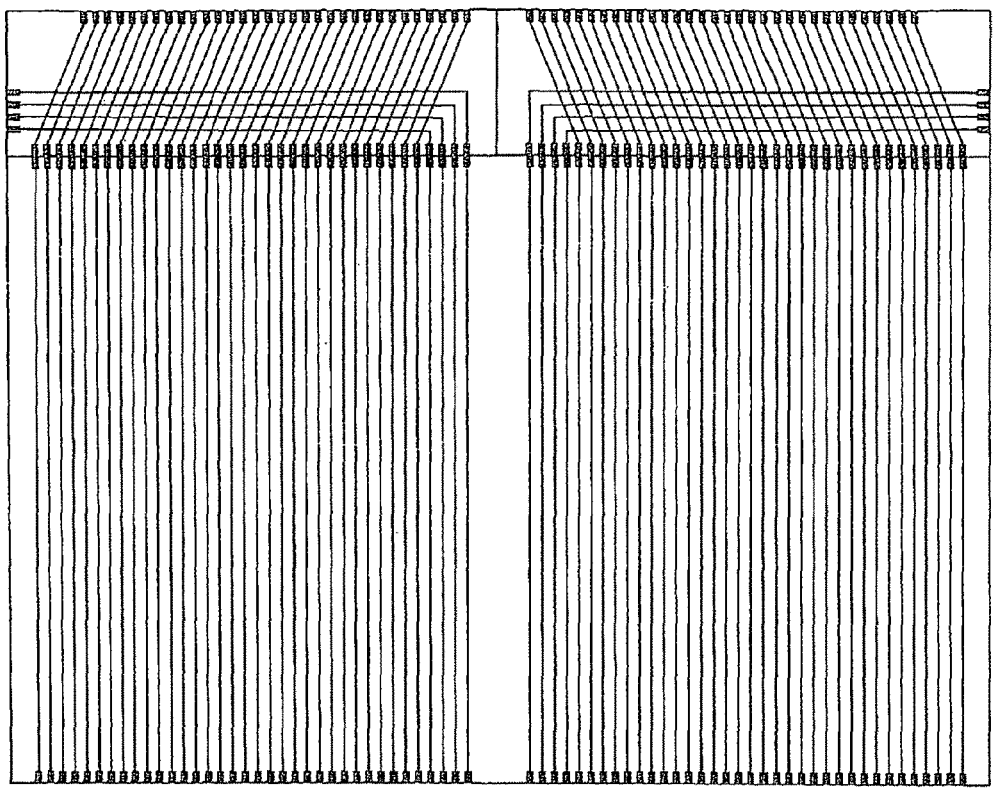
Figure 64:
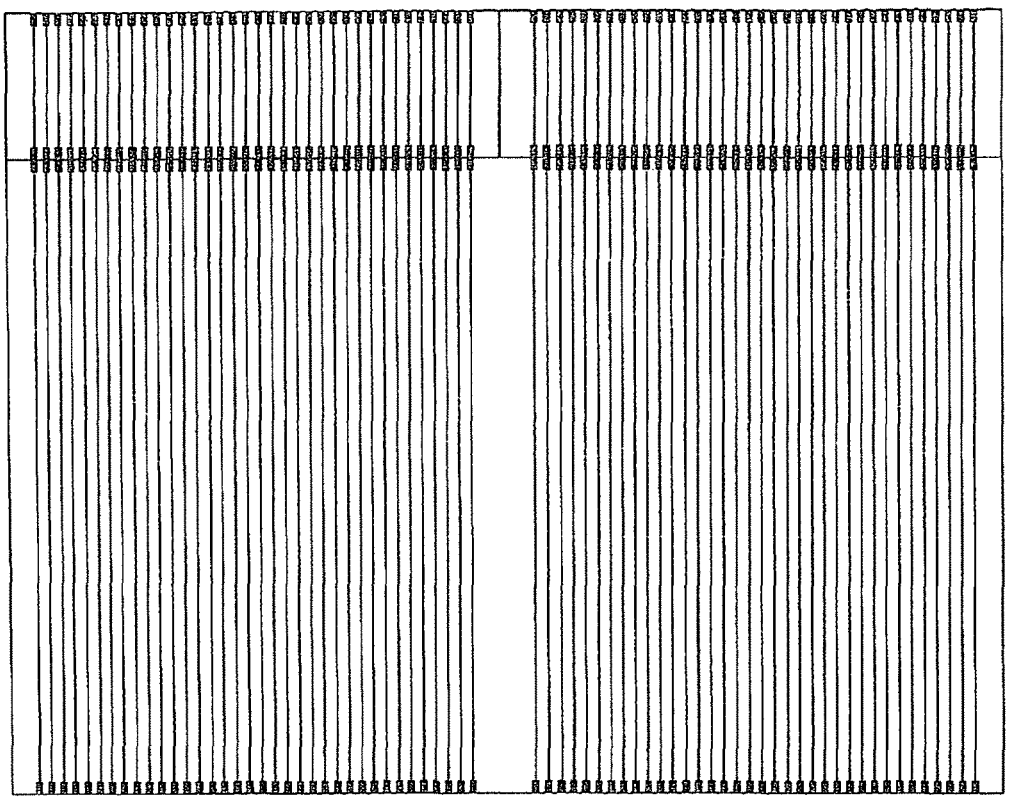
Figure 65:
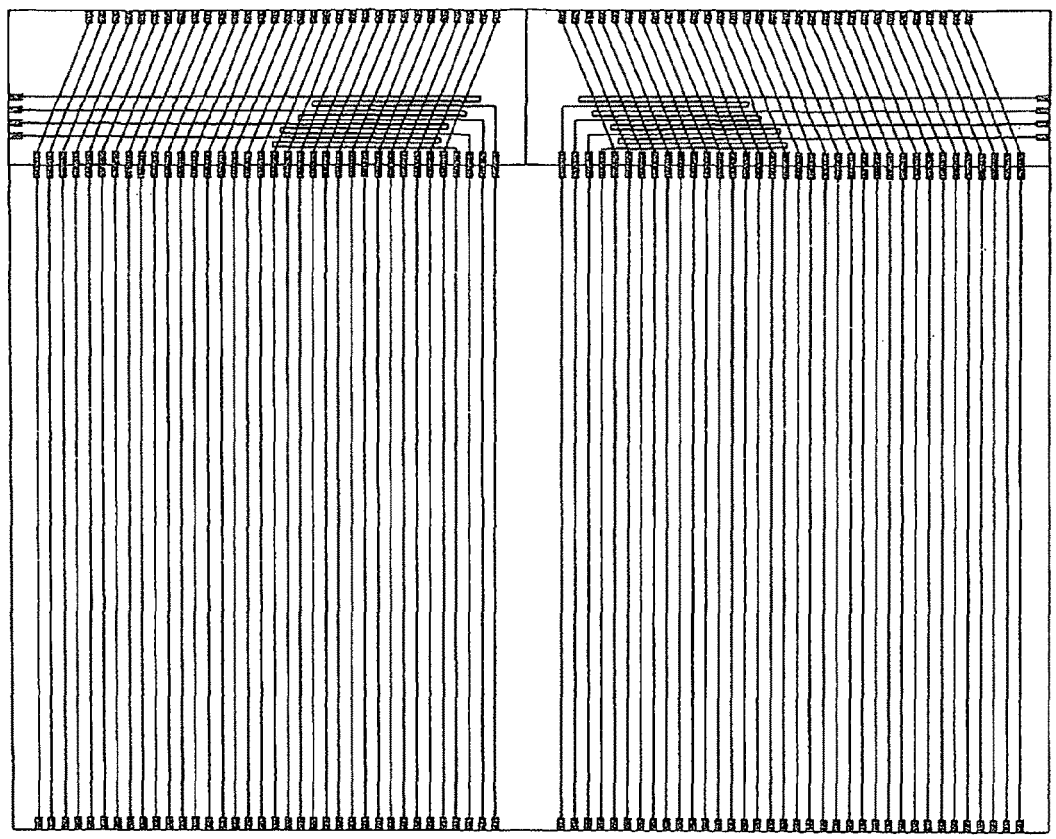
Figure 66:
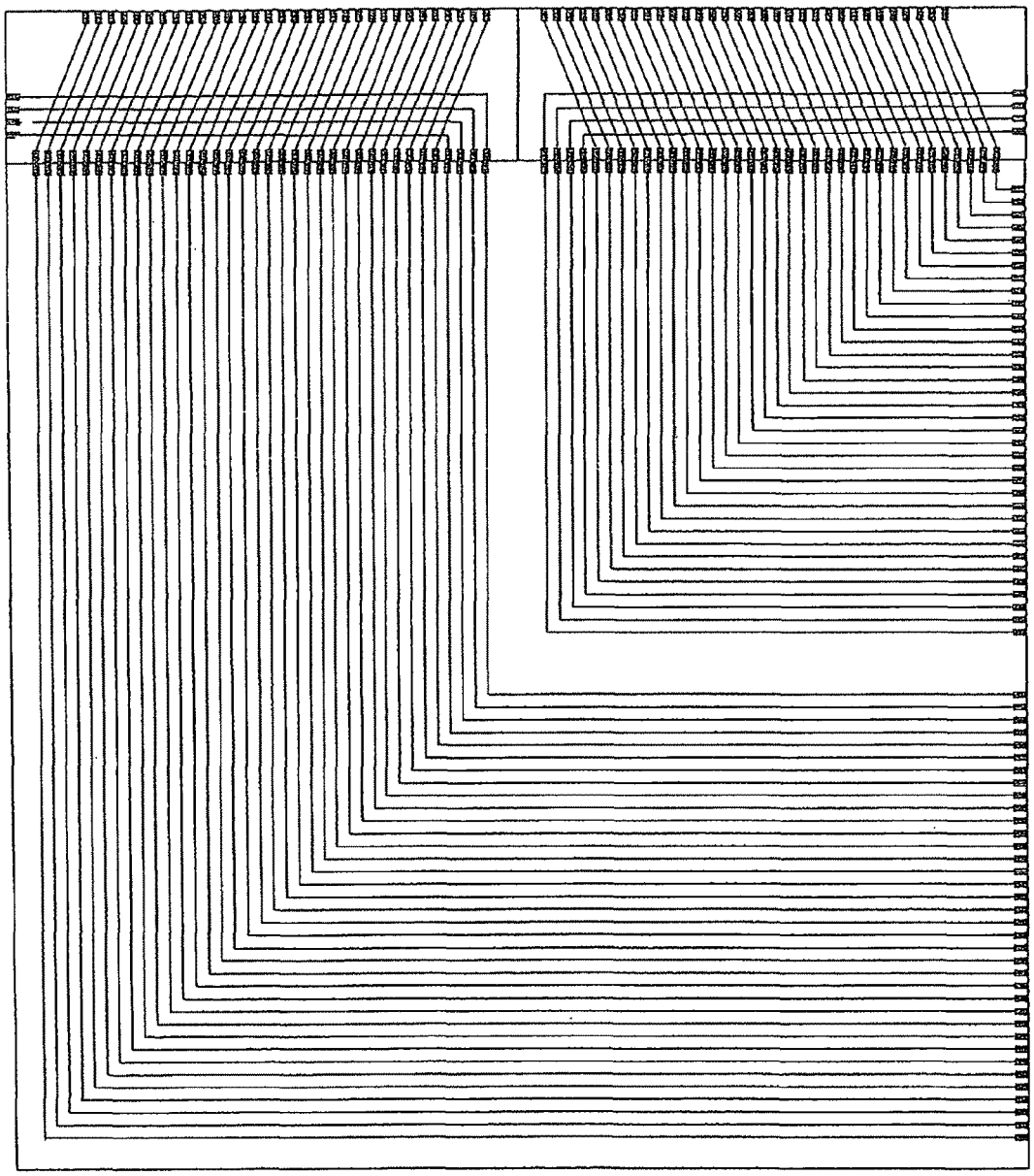
Figure 67:
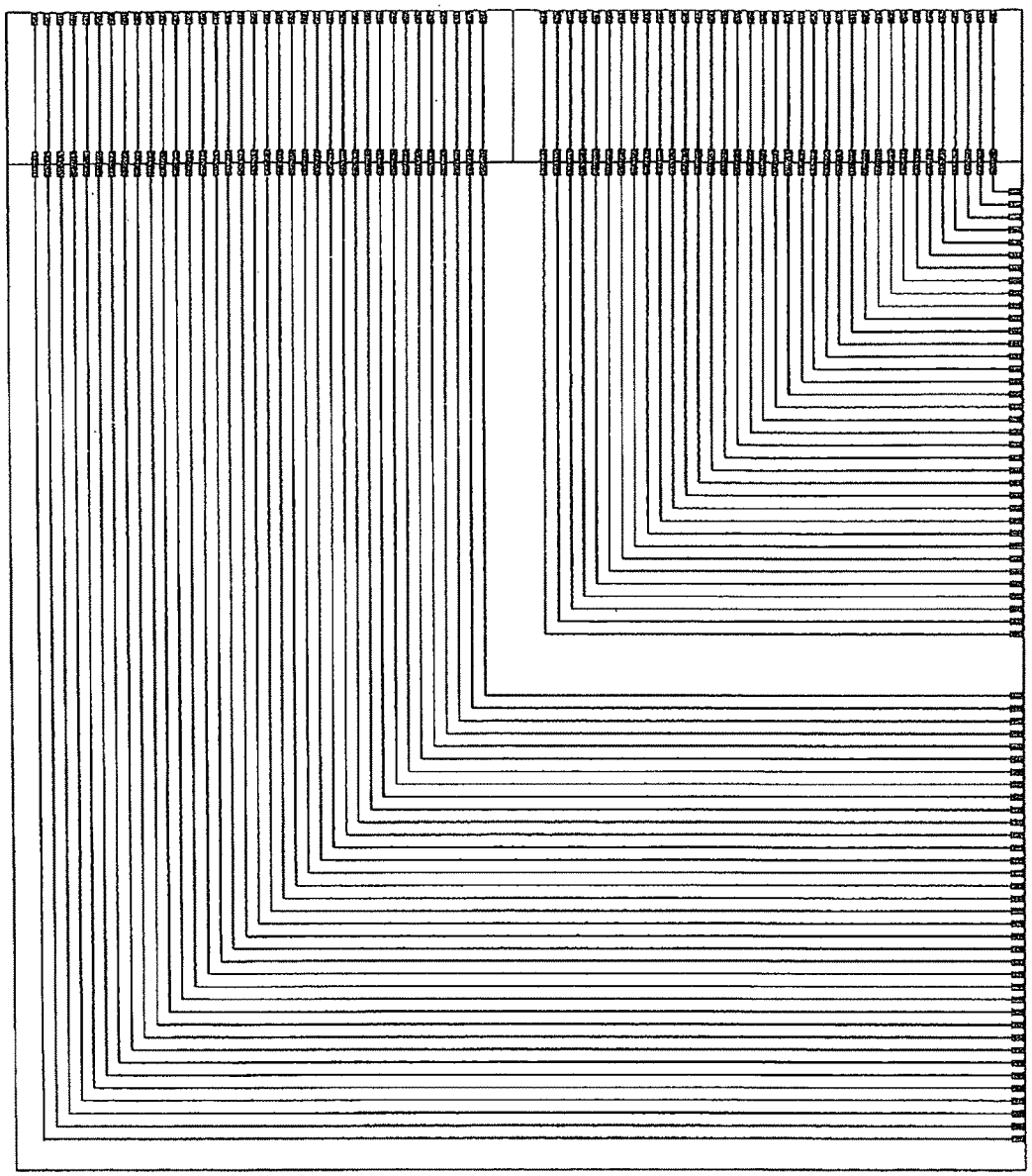
Figure 68:
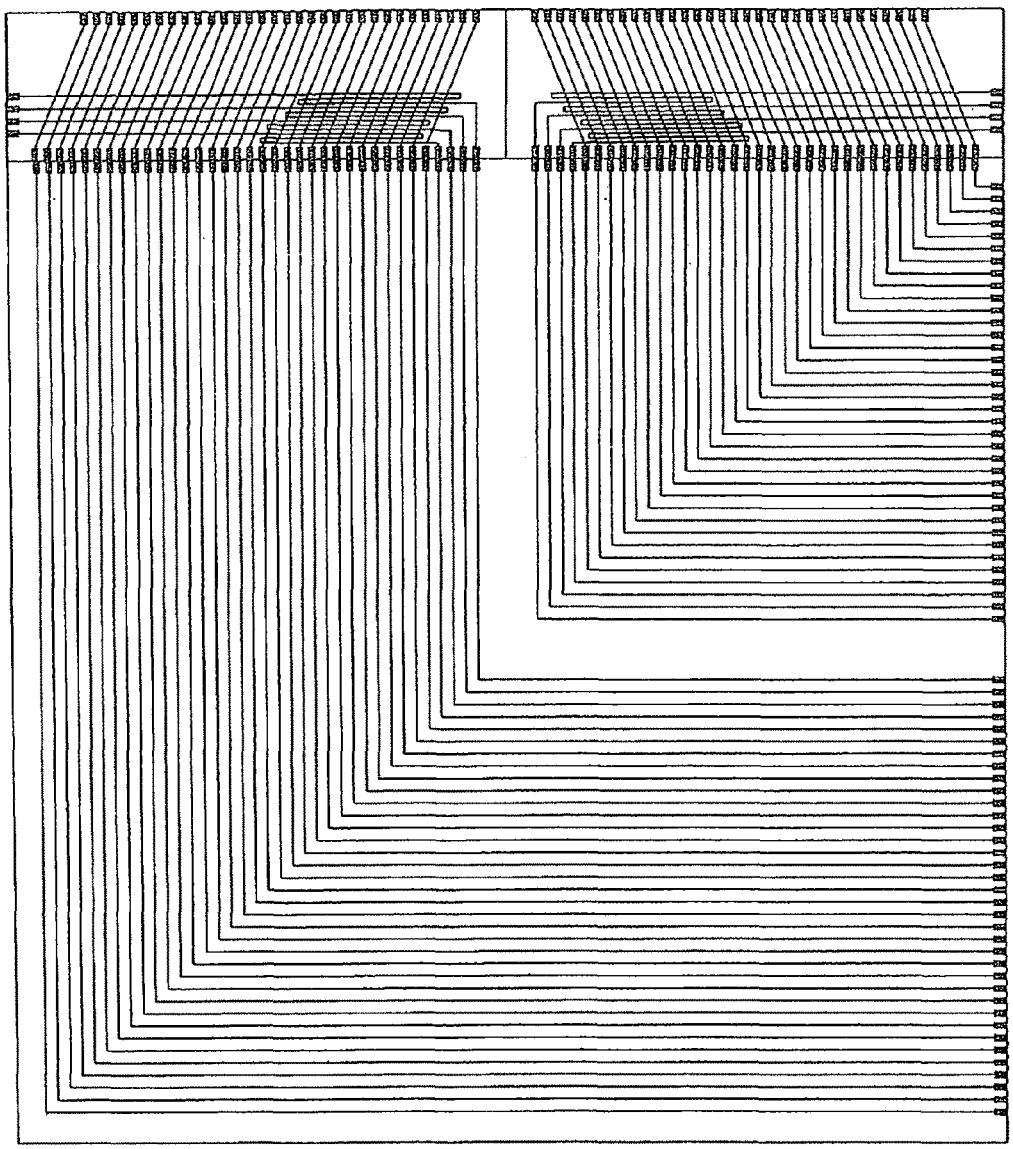
Figure 69:
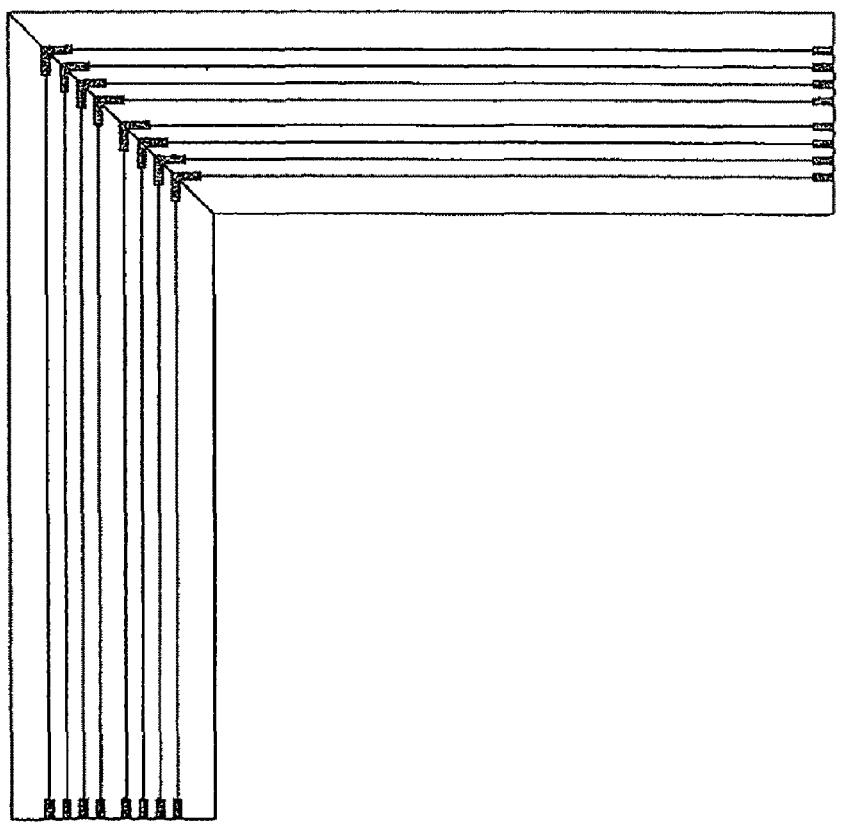

FIG. 32 is an example of a tile "11" for illustrative purpose. Most implementations will use multiple metal layers and vias to create ports and interconnect wiring.

The tile has height of T where,
if X is the IO cell width on the tree trunk.

$$T=2*X$$

The tile width is of arbitrary length. The shorter the width, the more precisely the interconnect root can place device 20 within the ASIC. Shorter width 10 tiles come at the expense of having to use many of them when device 20 must be located away form the interconnect tree. Tile 10 of multiple widths can be built to combine placement precision with reduced number of tile instantiations.

Ports 2, 3, 4 and 5 have S number of connections where, $$S >= (I-1)*P$$

Interconnect wiring 6 and 7 have length of M, where M can be any value preferably the minimum length possible for the tile.

Tile 10 can be rotated and flipped to fit the application.

All tiles, IO cells and device 20 connect by abutment. All the bus bit order is always maintained when abutting. FIGS. 33 to 69 illustrate various examples of how different tiles abut. The list of figures is not exhaustive, but rather a broad conceptual example of how tiles are placed together in layout.

Figure 70:
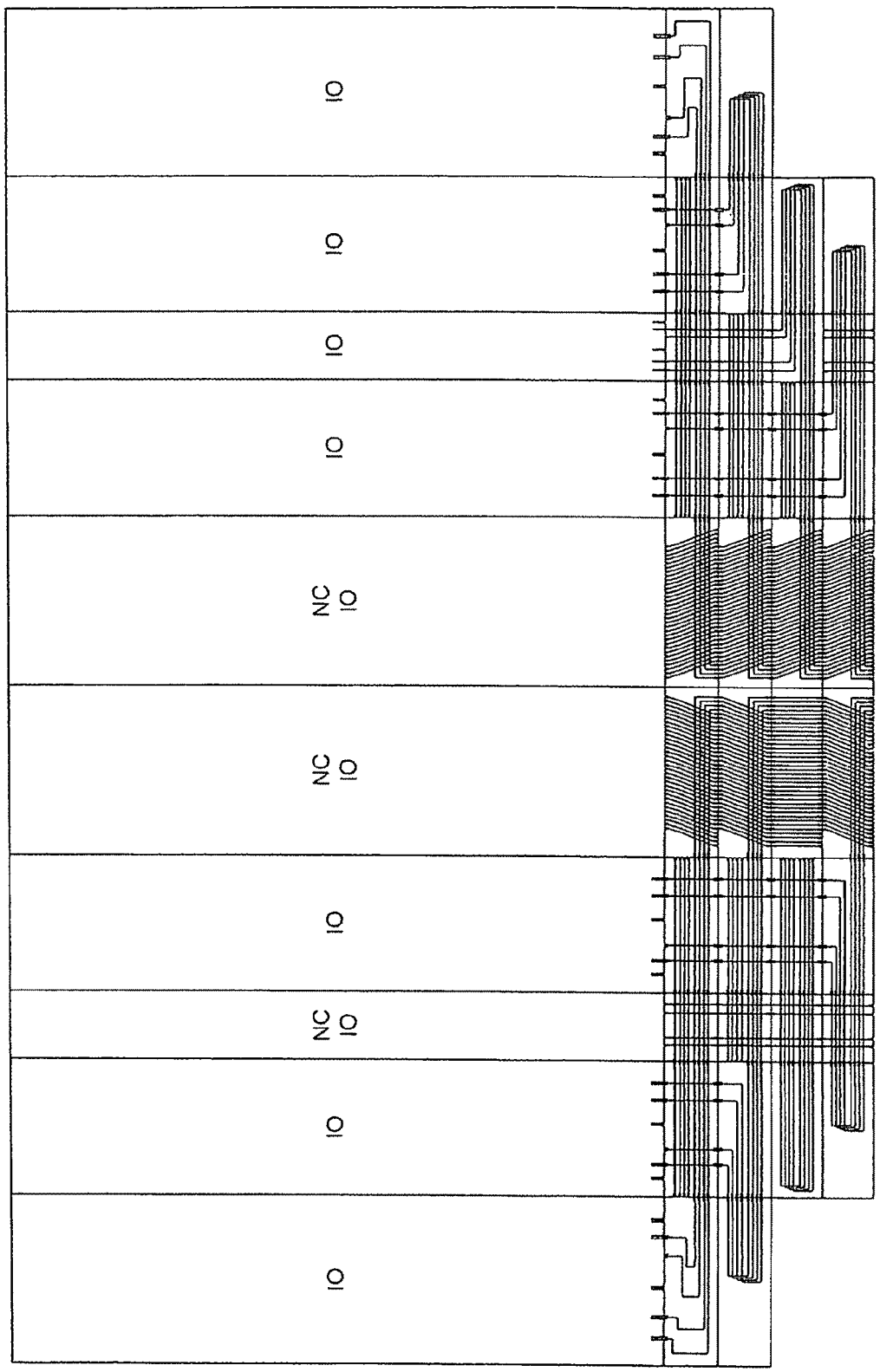
FIG. 70 shows the tile placement used to produce an example interconnect structure in accordance with one embodiment of the present invention.
Figure 71:
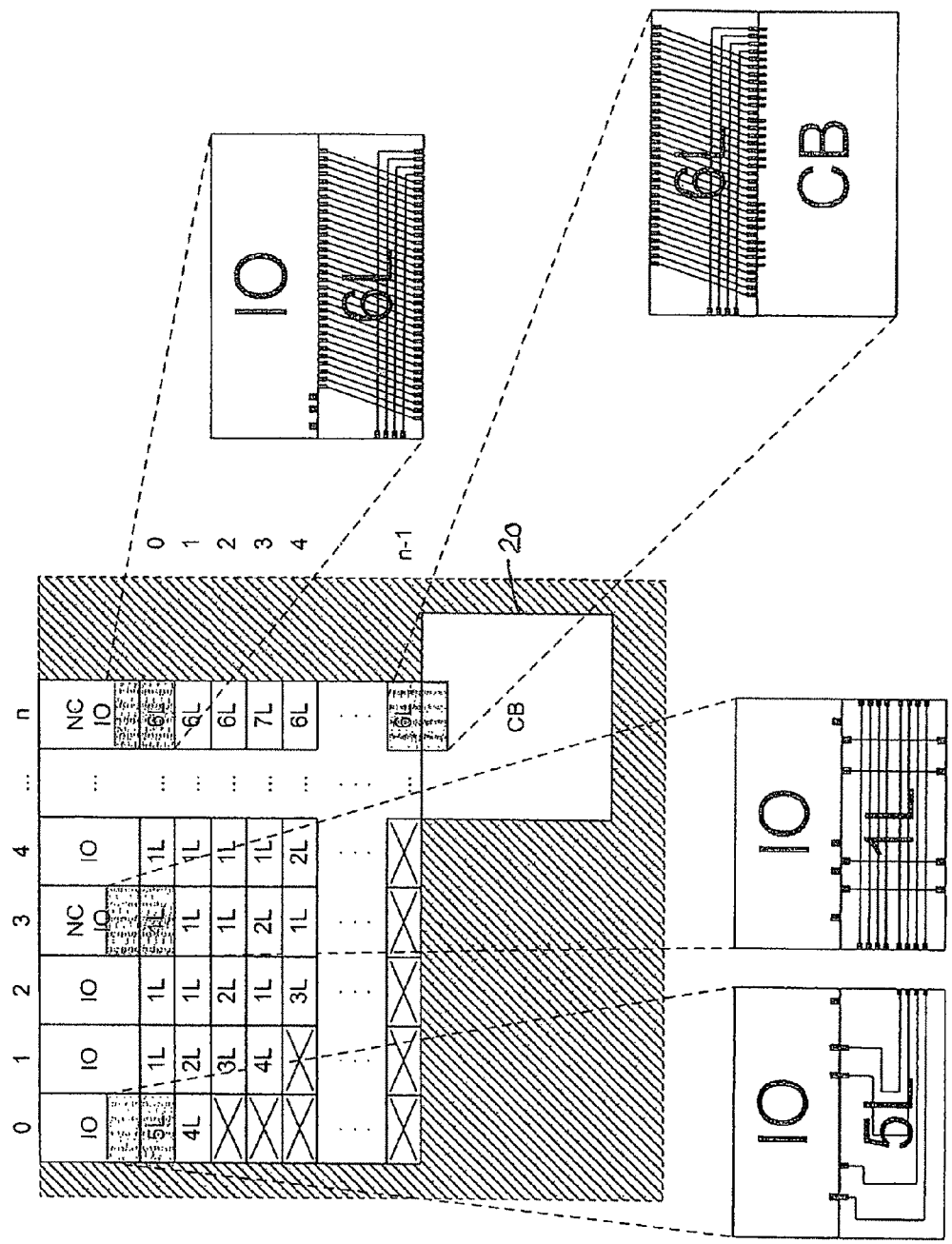
FIGS. 71 and 72 illustrate how various tiles are used for connection of the various devices to the interconnect circuitry in accordance with one embodiment of the present invention.

FIG. 70 illustrates the wiring layout produced for the relatively simple example of a balanced tree having a left tree section and a right tree section, each tree section having five cells associated therewith. In a typical embodiment, there will be many more cells provided along the wide interface, and FIG. 70 is merely provided for the purposes of illustration. As can be seen from FIG. 70, the individual wiring layouts within the various tiles provide the data paths through the interconnect and provide points of connection to each of the IO devices 32 that are to be connected into the interconnect. As shown in the example of FIG. 70, there are three such IO devices 32 in the left tree section and four such IO devices 32 in the right tree section. The manner in which the wiring layouts in individual tiles can be used to provide connections to connected IO devices 32, or to avoid connections to non-connected IO devices, is shown schematically in FIGS. 71 and 72. As shown in FIG. 71, the pin locations on the IO devices 32 that need to be connected are such that they connect with the required wiring layout on the adjacent tile, whilst those IO devices which do not need connections do not have alignment of their pins with the wiring layouts of the adjacent tile.

Figure 72:
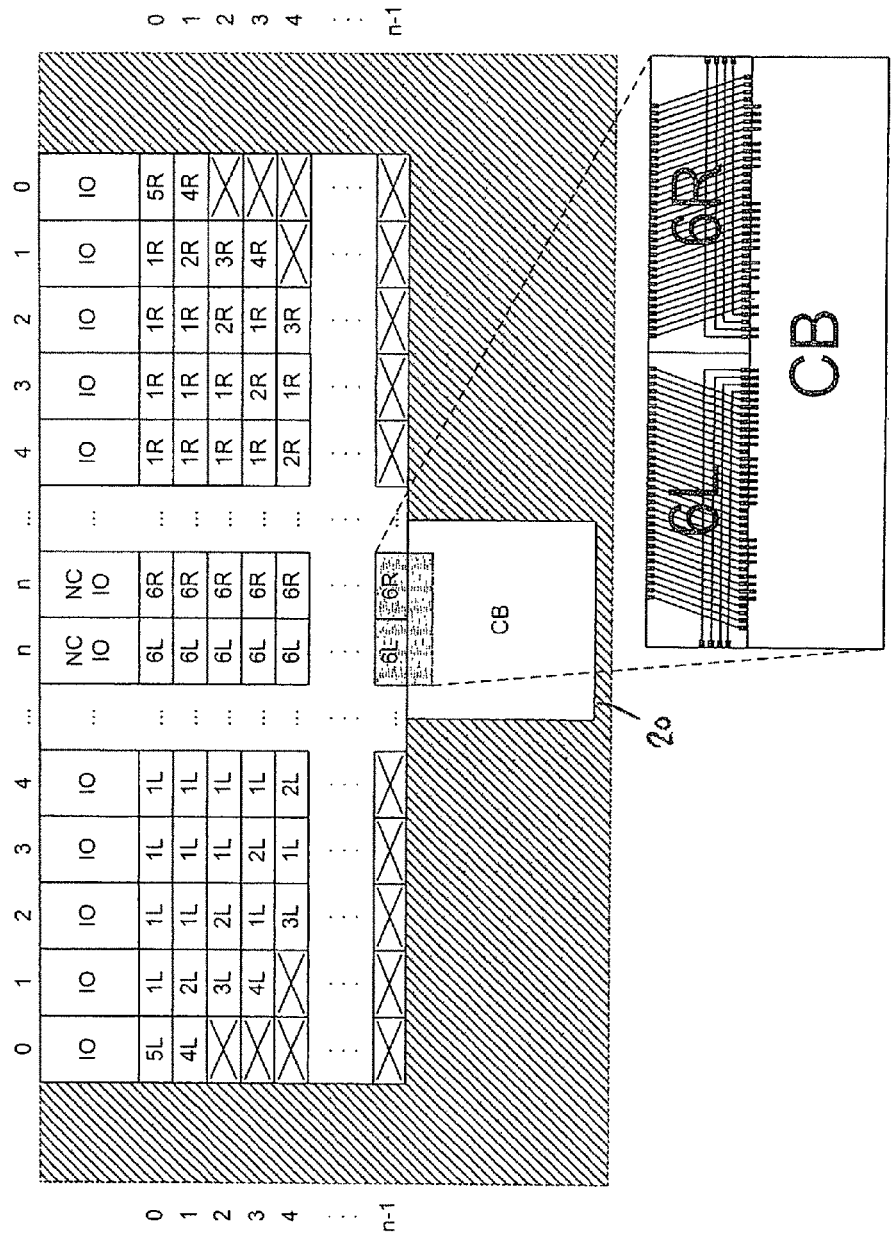

Similarly, in FIG. 72, this shows how a combination of a 6L and a 6R tile are used to provide the required connections to the device 20.

Figure 73:
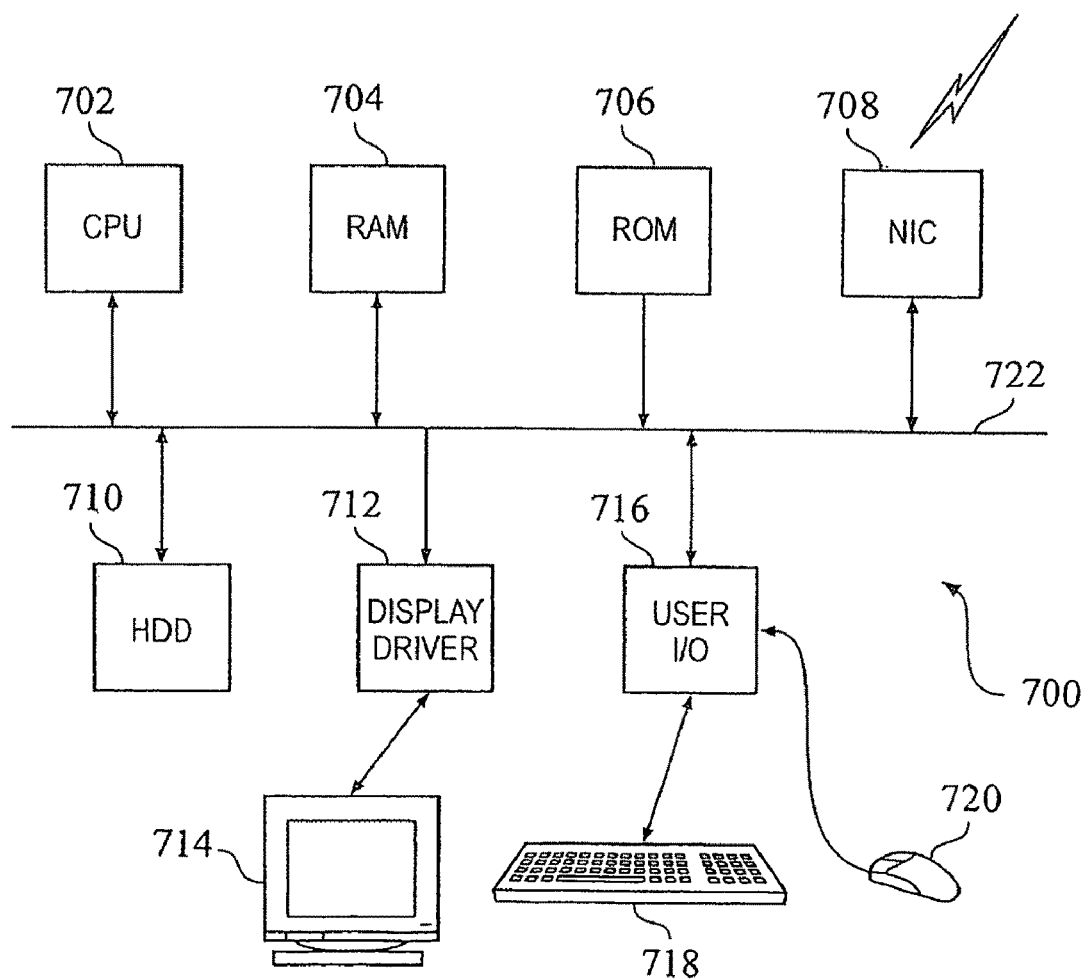
FIG. 73 schematically illustrates the architecture of a general purpose computer which may execute a computer program to implement the techniques of embodiments to the present invention.

FIG. 73 schematically illustrates a general purpose computer 700 of the type that may be used to implement the above described techniques. The general purpose computer 700 includes a central processing unit 702, a random access memory 704, a read only memory 706, a network interface card 708, a hard disk drive 710, a display driver 712 and monitor 714 and a user input/output circuit 716 with a keyboard 718 and mouse 720 all connected via a common bus 722. In operation the central processing unit 702 will execute computer program instructions that may be stored in one or more of the random access memory 704, the read only memory 706 and the hard disk drive 710 or dynamically downloaded via the network interface card 708. The results of the processing performed may be displayed to a user via the display driver 712 and the monitor 714. User inputs for controlling the operation of the general purpose computer 700 may be received via the user input output circuit 716 from the keyboard 718 or the mouse 720. It will be appreciated that the computer program could be written in a variety of different computer languages. The computer program may be stored and distributed on a recording medium or dynamically downloaded to the general purpose computer 700. When operating under control of an appropriate computer program, the general purpose computer 700 can perform the above described techniques for determining routing of data paths in an interconnect circuit, and can be considered to form an apparatus for performing the above described techniques. The architecture of the general purpose computer 700 could vary considerably and FIG. 73 is only one example.

In the above described embodiments of the present invention, for any block locations where wiring layout is not required, no tiles are instantiated (see for example the tiles marked as "x" in FIGS. 5 to 8). However, in an alternative embodiment, the predetermined set of tiles could include filler tiles used to instantiate tiles for those blocks. In one embodiment, those filler tiles will have metal fill to satisfy the metal density requirements for the given manufacturing process.

Further, in some embodiments, the IO cell libraries may have short corner IO cells, which will limit the number of branches that can be provided on the far side of the corner cell (with respect to the trunk) without layout congestion. In one embodiment, this can be alleviated by defining filler elements on either side of the corner element, and then implementing each filler element using predetermined filler tiles provided within the predetermined set of tiles. Such filler tiles in combination with the corner tile will effectively extend the size of the corner element to allow for building tree structures that require a large number of branches on the far side of the corner element.

In the earlier described embodiments, various of the tiles have separate instantiations for every possible width of cell. However, in an alternative embodiment, the need to provide tiles for every possible width of cell can be avoided through the use of filler cells. More particularly, the filler cells can be combined with existing IO cells in order to create a combined IO cell library which will have the same width for each IO cell. This will significantly reduce the number of tile widths that need to be provided within the predetermined set of tiles in order to build the interconnect circuit.

In the earlier described embodiments, the various devices that are to be connected to the tree structure of the interconnect circuit are arranged to directly connect to the adjacent tile in the associated column of the interconnect circuit. However, in an alternative embodiment, one or more bridge tiles may be provided that provide pin mappings between pins of those devices and the wiring layouts of the tiles in the predetermined set of tiles. These bridge tiles hence convert the IO device's pin location to conform to the pin location required for abutting the IO device to the interconnect tree. These cells can also serve to separate the interconnect circuit from the devices so as to avoid accidental abutting to IO devices/components which do not require connection through the interconnect circuit. Such a bridge tile can also be used to create an IO device interface which has ports with vertical symmetry allowing the reuse of the tile wiring design for left and right trees through a horizontal flip.

From the above description of embodiments of the present invention, it will be appreciated that such embodiments have the following advantages:

1. An interconnect circuit designed using the techniques of embodiments of the present invention enables two physical blocks to be connected where there are huge size differences between their interfaces;

2. An interconnect circuit designed using the techniques of embodiments of the present invention is able to handle differential signals effectively—in particular the symmetrical wire length and parasitic matching (physical effects matching) properties of embodiments of the present invention makes it particularly suitable for handling differential signals;

3. The technique provides an exactly matched propagation delay, and can also match other physical aspects such as coupling, cross talk, loading, noise shielding, etc;

4. The technique can handle a mixture of IO devices with different widths;

5. The technique is able to effectively handle different mixtures of IO devices connecting through the interconnect and IO devices/components not connecting through the interconnect without modifying the core interface pin and signal location;

6. The core interface can be placed anywhere in relation to the IO device placement, through the use of the earlier-mentioned root channel.

7. The technique can provide separate optimized topologies, for left, right and centred core interface placement;

8. The technique provides a structured routing method using predetermined tiles with predetermined wiring layouts;

9. It is possible to build a wide variety of different interconnects using only a small number of predetermined layout elements (tiles);

10. Interconnects built using the techniques of embodiments of the present invention have pre-characterised timing based on exact geometrical information;

11. The technique is algorithm based, and can be instantly compiled for various bus widths based on a feed forward approach. Unlike most known ASIC tools, no iterations of the process are required;

12. Interconnects designed using the technique of embodiments of the present invention typically exhibit reduced power consumption compared with those designed using prior art tools, because the present technique avoids the need to insert buffers and other components in various paths in order to improve the timing and matching of delays.

The technique of embodiments of the present invention can be applied to all high speed busses which require a high degree of timing matching when connecting them to blocks which are physically far apart. The technique of embodiments of the present invention is especially suited for connecting parallel busses from a localised design to IO cells on integrated circuits, where the data path physical widths differ greatly in size. Memory interfaces such SDR, DDR and parallel bus architectures such as PCI are prime examples of technologies which will greatly benefit from the use of the technique of embodiments of the present invention. As the data rate of those architectures increases, the technique of embodiments of the present invention will be particularly beneficial.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. A method of determining routing of data paths in interconnect circuitry for an integrated circuit, the interconnect circuitry on a first side of said circuit providing a narrow interface for connection to a first device and on a second side of said circuit providing a wide interface for connection to a distributed plurality of further devices, each data path being associated with one of said further devices and providing a connection through the interconnect circuitry, between that associated, further device and the first device, the method comprising the steps of:

(i) defining a plurality of cells to be provided along the wide interface, each of the further devices being associated with at least one of said cells;

(ii) defining the interconnect circuitry as an array of blocks formed in rows and columns, each cell abutting one of said columns;

(iii) providing a predetermined set of tiles, each tile providing a predetermined wiring layout; and (iv) for each block, applying predetermined rules to determine one of said tiles to be used to implement that block, the predetermined rules taking into account the location of the block in the array, and the association between the plurality of further devices and the plurality of cells, and ensuring that each data path provided by the interconnect circuitry has the same propagation delay, said method steps are implemented on a computer system.

2. A method as claimed in claim 1, wherein each data path is formed by a sequence of tiles, each tile in the sequence being selected to have a wiring layout that at least partially abuts with the wiring layout in an adjacent tile of the sequence.

3. A method as claimed in claim 1, wherein:
the predetermined rules allocate tiles to individual blocks in the array so as to produce a tree structure, at least one column abutting the narrow interface being formed as a trunk of the tree structure, and the rows in the remaining columns forming branches of the tree structures;
at said step (iv), when determining tiles to be used to implement individual blocks in the array, said predetermined rules taking into account whether a block is in the trunk of the tree structure or a branch of the tree structure.

4. A method as claimed in claim 3, wherein:
said predetermined set of tiles comprise a predetermined subset of trunk tiles and a predetermined subset of branch tiles, during said step (iv), the predetermined rules selecting, for each block, a tile from the subset of trunk tiles if the block is in the trunk of the tree structure, or a tile from the subset of branch tiles if the block is in a branch of the tree structure.

5. A method as claimed in claim 3, wherein:
the number of cells exceeds the number of further devices to be connected to said wide interface, such that at least one non-connect cell exists that does not have one of said further devices associated therewith; and
for each column formed as a trunk of the tree structure, the cell chosen to abut that column being a non-connect cell.

6. A method as claimed in claim 3, wherein the tree structure comprises one or more tree sections, each tree section having one column abutting the narrow interface to form a trunk for that tree section, and the rows in the remaining columns of the tree section forming branches of that tree section.

7. A method as claimed in claim 6, wherein at least one tree section is provided on a different to at least one other tree section.

8. A method as claimed in claim 6, wherein each tree section comprises either a left tree section, or a right tree section, at said step (iv) the predetermined rules applied being dependent on whether tiles are being determined for blocks of a left tree section or are being determined for blocks of a right tree section, whilst still ensuring that each data path provided by the interconnect circuitry, whether in a left tree section or a right tree section, has the same propagation delay.

9. A method as claimed in claim 1, wherein the distributed plurality of further devices are distributed along a distribution path following at least one axis.

10. A method as claimed in claim 9, wherein at least one point in the distribution path a change in axis takes place, the method further comprising the steps of:
- at said step (ii), defining a corner element within the interconnect circuitry in association with each point in the distribution path where a change in axis take place, such that each corner element defines a change of axis between two adjacent columns of blocks in the array;
- at said step (iv), the predetermined rules implementing each corner element using predetermined corner tiles contained with said predetermined set of tiles, and when determining tiles to be used for each block in the array the predetermined rules taking into account the location of any corner elements within the interconnect circuitry so as to ensure that each data path provided by the interconnect circuitry has the same propagation delay.

11. A method as claimed in claim 10; wherein at said step (ii) a filler element is defined on either side of the corner element, and at said step (iv) the predetermined rules implement each filler element using predetermined filler tiles contained with said predetermined set of tiles.

12. A method as claimed in claim 1, wherein the number of cells exceeds the number of further devices to be connected to said wide interface, such that at least one non-connect cell exists that does not have one of said further devices associated therewith, and the method further comprises associating with one or more non-connect cells one or more other components of the integrated circuit not requiring connection to the interconnect circuitry.

13. A method as claimed in claim 12, wherein said other components comprise power supply lines used to power the distributed plurality of further devices.

14. A method as claimed in claim 1, wherein during said step (iv), if the predetermined rules determine that no wiring layout is required at the location of a particular block, no tile is allocated for that block.

15. A method as claimed in claim 1, wherein said predetermined set of files include one or more filler tiles having no wiring layout, and during said step (iv), if the predetermined rules determine that no wiring layout is required at the location of a particular block, one of said filler tiles is allocated for that block.

16. A method as claimed in claim 1, wherein at said step (i) the plurality of cells defined are of a plurality of different widths, and the predetermined set of tiles include tiles having a corresponding plurality of different widths, so as to enable each cell to abut one of said columns.

17. A method as claimed in claim 1, wherein at said step (i) certain cells are formed by a combination of an initial cell and a filler cell, such that each cell abutting with a column in the array is of equal width.

18. A method as claimed in claim 1, further comprising the step of:
- defining a root channel passing from the narrow interface of the interconnect circuitry to the first device; thereby allowing placement of the first device within the integrated circuit at a location other than that of the narrow interface.

19. A method as claimed in claim 18, wherein said predetermined set of tiles include a subset of root tiles, the method further comprising the step of producing the root channel using one or more root tiles from said subset.

20. A method as claimed in claim 1, wherein the distributed plurality of further devices comprise input/output devices placed around the periphery of the integrated circuit.

21. A method as claimed in claim 20, wherein the first device is a memory controller device used to control the plurality of input/output devices.

22. A method as claimed in claim 1, further comprising the steps of:
- providing one or more bridge tiles that provide pin mappings between pins of said further devices and wiring layouts of tiles in said predetermined set of tiles; and
- when, for a particular further device, there is not a direct mapping of its pins to the wiring layout of the tile in the interconnect circuitry that it is to abut to, introducing at least one bridge tile between said particular further device and said tile in the interconnect circuitry to map the pins of said particular further device to the wiring layout of that tile.

23. A method as claimed in claim 1, wherein the number of cells exceeds the number of further devices to be connected to said wide interface, such that at least one non-connect cell exists that does riot have one of said further devices associated therewith, addition of such non-connect cells along the wide interface having no effect on the width of the narrow interface.

24. A method as claimed in claim 23, wherein addition of such non-connect cells along the wide interface further has no effect on the order in which the data paths connect to the narrow interface.

25. A method as claimed in claim 1, wherein the wiring layout of at least one of the tiles in the predetermined set is such that when that at least one of the tiles is used to implement a block within said array, not all of the wiring layout within that file is utilised.

26. A computer program product comprising a non-transitory computer readable storage medium having a computer program stored thereon, which program, when executed on a computer system, causes the computer system to perform a method to determine routing of data paths in interconnect circuitry for an integrated circuit, the interconnect circuitry on a first side of said circuit providing a narrow interface for connection to a first device and on a second side of said circuit providing a wide interface for connection to a distributed plurality of further devices, each data path being associated with one of said further devices and providing a connection through the interconnect circuitry between that associated further device and the first device, the method comprising the steps of:
- defining a plurality of cells to be provided along the wide interface, each of the further devices being associated with at least one of said cells;
- defining the interconnect circuitry as an array of blocks formed in rows and columns, each cell abutting one of said columns;
- providing a predetermined set of tiles, each tile providing a predetermined wiring layout; and
- for each block, applying predetermined rules to determine one of said tiles to be used to implement that block, the predetermined rules taking into account the location of the block in the array, and the association between the plurality of further devices and the plurality of cells, and ensuring that each data path provided by the interconnect circuitry has the same propagation delay.

27. A system for determining routing of data paths in interconnect circuitry for an integrated circuit, the interconnect circuitry on a first side providing a narrow interface for, connection to a first device and on a second side providing a wide interface for connection to a, distributed plurality of further devices, each data path being associated with one of said further devices and providing a connection through the interconnect circuitry between that associated further device and the first device, the system comprising:
- means for defining a plurality of cells to be provided along the wide interface, each of the further devices being associated with at least one of said cells;
- means for defining the interconnect circuitry as an array of blocks formed in rows and columns, each cell abutting one of said columns;
- means for providing a predetermined set of tiles, each tile providing a predetermined wiring layout; and
- data path determining means which, for each block, applies predetermined rules to determine one of said tiles to be used to implement that block, the predetermined rules taking into account the location of the block in the array, and the association between the plurality of further devices and the plurality of cells, and ensuring that each data path provided by the interconnect circuitry has the same propagation delay.

* * * * *